United States Patent
Fukuta

(10) Patent No.: US 10,081,253 B2
(45) Date of Patent: Sep. 25, 2018

(54) DRIVING DEVICE FOR SEMICONDUCTOR SWITCHING ELEMENT AND CONTROL SYSTEM FOR POWER CONVERTER

(71) Applicant: DENSO CORPORATION, Kariya, Aichi-pref. (JP)

(72) Inventor: Junichi Fukuta, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/012,448

(22) Filed: Feb. 1, 2016

(65) Prior Publication Data

US 2016/0226386 A1 Aug. 4, 2016

(30) Foreign Application Priority Data

Jan. 30, 2015 (JP) .................................. 2015-016730

(51) Int. Cl.
*H03K 17/16* (2006.01)
*B60L 11/18* (2006.01)
(Continued)

(52) U.S. Cl.
CPC .............. *B60L 11/18* (2013.01); *H02P 21/22* (2016.02); *H02P 29/027* (2013.01); *H03K 17/0412* (2013.01); *H03K 17/162* (2013.01); *H03K 17/168* (2013.01); *Y02T 10/643* (2013.01); *Y02T 10/7005* (2013.01)

(58) Field of Classification Search
CPC ........ G11B 5/02; G11B 5/022; H03K 17/601; H03K 17/64; H03K 17/691; H03K 17/731; H03K 17/10; H03K 17/102; H03K 17/107; H03K 17/12; H03K 17/122; H03K 17/127;
(Continued)

(56) References Cited

U.S. PATENT DOCUMENTS 7,518,416 B2 * 4/2009 Yang ................. H02M 3/33507
327/110
8,717,788 B2 * 5/2014 Chen ....................... H02M 1/15
363/56.01

(Continued)

FOREIGN PATENT DOCUMENTS

JP      2008-228447 A    9/2008
JP         4844653 B2   12/2011
WO     2012/111273 A1   8/2012

*Primary Examiner* — Timothy J Dole
*Assistant Examiner* — Bryan R Perez
(74) *Attorney, Agent, or Firm* — Oliff PLC

(57) ABSTRACT

In a driving device for changing a semiconductor switching element, having an on-off control terminal, between an on state and an off state according to a power supply voltage input thereto, a constant-current driver generates a constant current based on the power supply voltage. The constant-current driver performs one of charging and discharging of the on-off control terminal of the semiconductor switching element based on the generated constant current so as to change the semiconductor switching element from one of the on state and off state to the other thereof. A rate varying unit adjusts, based on correlation information between the power supply voltage and the constant current, a value of the constant current so as to vary a rate of changing the semiconductor switching element from one of the on state and the off state to the other thereof.

14 Claims, 11 Drawing Sheets

(51) Int. Cl.
*H03K 17/0412* (2006.01)
*H02P 29/024* (2016.01)
*H02P 21/22* (2016.01)

(58) Field of Classification Search
CPC .... H03K 17/161; H03K 17/302; H03K 17/56; H03K 17/567
USPC ................ 363/55–56.11, 65, 71, 72, 40, 41; 307/11, 43, 58, 82; 327/108–110
See application file for complete search history.

(56) References Cited

U.S. PATENT DOCUMENTS

| | | | | |
|---|---|---|---|---|
| 2011/0012542 | A1* | 1/2011 | Inamura | H02M 1/08 |
| | | | | 318/139 |
| 2012/0025897 | A1* | 2/2012 | Wasekura | H03K 17/14 |
| | | | | 327/518 |
| 2012/0242376 | A1* | 9/2012 | Ose | H03K 17/14 |
| | | | | 327/109 |
| 2012/0299624 | A1* | 11/2012 | Sugahara | H03K 17/168 |
| | | | | 327/109 |
| 2013/0181640 | A1* | 7/2013 | Fukuta | H03K 17/166 |
| | | | | 318/139 |
| 2014/0307495 | A1* | 10/2014 | Fukuta | H02H 3/08 |
| | | | | 363/98 |
| 2015/0155816 | A1 | 6/2015 | Saito et al. | |

* cited by examiner

FIG.4A
| OPERATIONS OF CONTROL DEVICE | VH | LOW ←——→ HIGH |
| | TD | HIGH ←——→ LOW |
| | Is | LOW ←——→ HIGH |
| | TCR | HIGH ←——→ LOW |
| | Vref | HIGH ←——→ LOW |
| | Vom | HIGH ←——→ LOW |
| OPERATIONS OF RATE VARYING UNIT | Ic | HIGH ←——→ LOW |
| | Id | LOW ←——→ HIGH |
FIG.4B
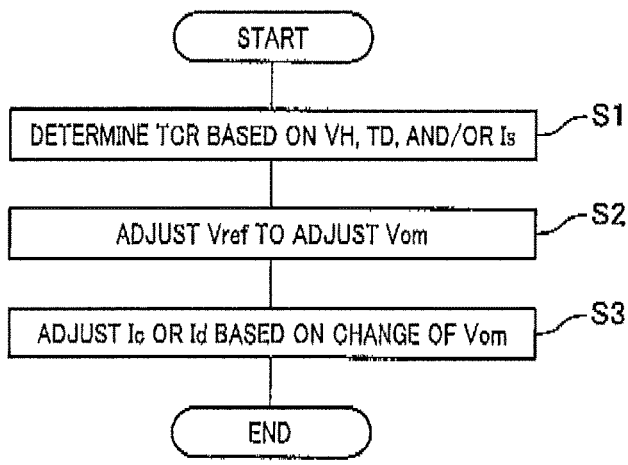
FIG.5
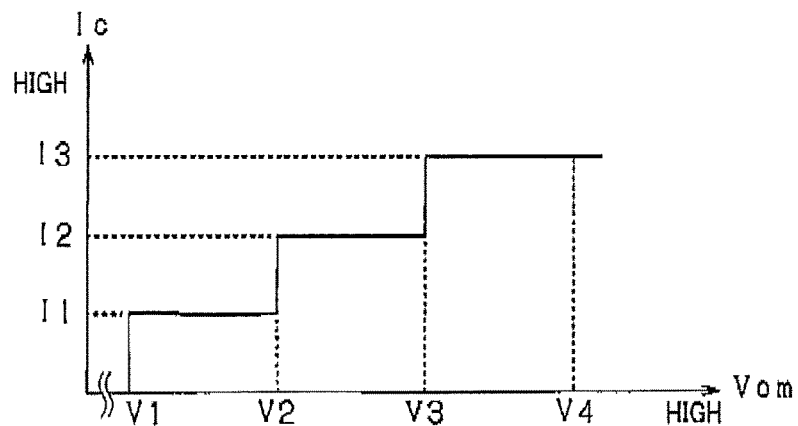

FIG.7A
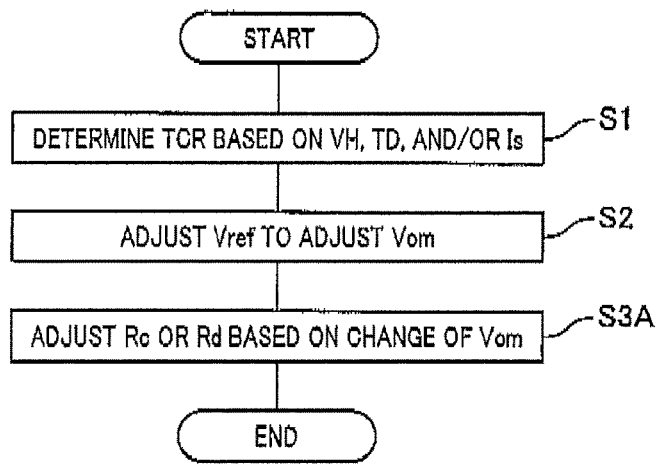
FIG.7B
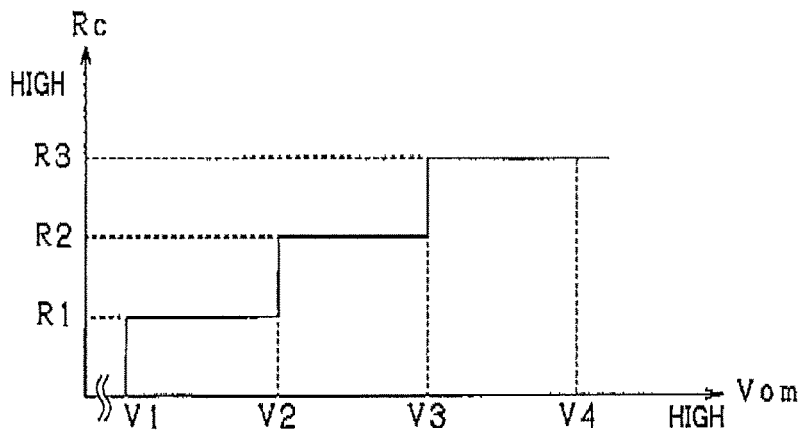
FIG.8

| | | | |
|---|---|---|---|
| OPERATIONS OF CONTROL DEVICE | VH | LOW ←——→ HIGH | |
| | TD | HIGH ←——→ LOW | |
| | Is | LOW ←——→ HIGH | |
| | TCR | HIGH ←——→ LOW | |
| | Vref | HIGH ←——→ LOW | |
| | Vom | HIGH ←——→ LOW | |
| OPERATIONS OF RATE VARYING UNIT | Ra | LOW ←——→ HIGH | |
| | Rb | LOW ←——→ HIGH | |

FIG.12A
|  | Scp | Scn |
|---|---|---|
| POWER RUNNING MODE | OFF | ON AND OFF |
| REGENERATIVE MODE | ON AND OFF | OFF |
FIG.12B
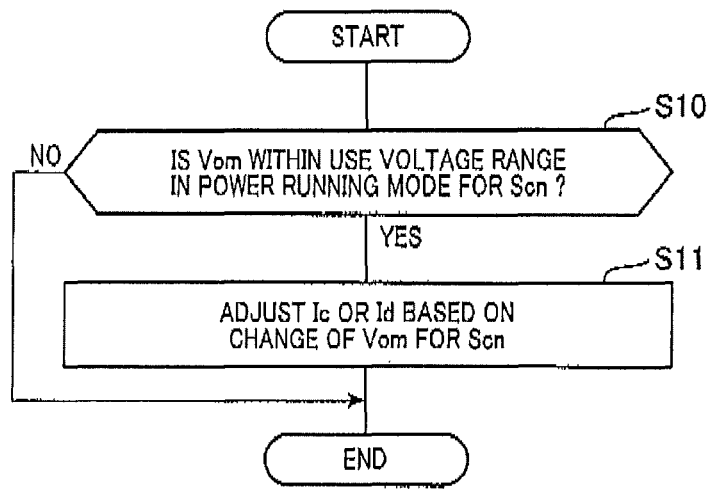
FIG.12C
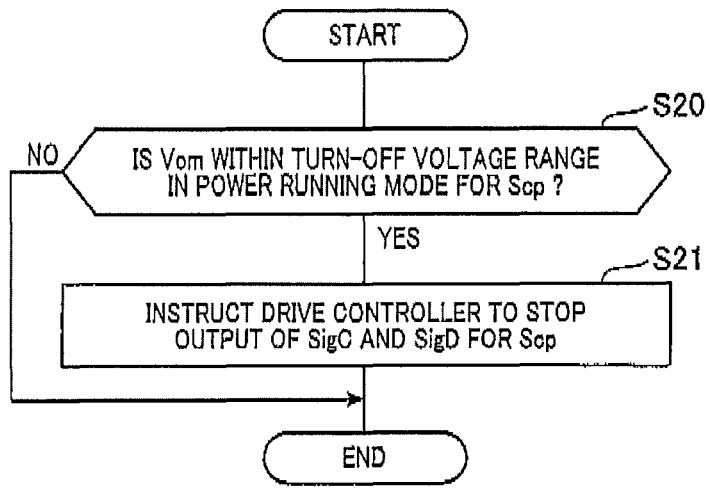

DRIVING DEVICE FOR SEMICONDUCTOR SWITCHING ELEMENT AND CONTROL SYSTEM FOR POWER CONVERTER

CROSS REFERENCE TO RELATED APPLICATION

This application is based on and claims the benefit of priority from Japanese Patent Application No. 2015-016730 filed on Jan. 30, 2015, the disclosure of which is incorporated in its entirety herein by reference.

TECHNICAL FIELD

The present disclosure relates to driving devices for driving a semiconductor switching element; the driving devices are capable of varying the switching speed of the semiconductor switching element, in other words, the rate of chaining, i.e. switching, the semiconductor switching element between its switching states, i.e. on and off states.

BACKGROUND

For example, Japanese Patent Publication No. 4844653 discloses such a driving device in the technical field. The driving device disclosed in the Patent Publication aims to increase the rate of changing an insulated gate bipolar transistor (IGBT), as an example of semiconductor switching elements, between its switching states while limiting a surge generated due to changing of the IGBT between its switching states.

In particular, the disclosed driving device is designed as a regulated-voltage control driving device, and includes a drive circuit and a voltage controller. The drive circuit uses, as a power source therefor, an output voltage across a secondary coil of a transformer. Specifically, the drive circuit includes a regulator for regulating the output voltage across the secondary coil, and intermittently applies the regulated voltage to the on-off control terminal, i.e. the gate, of the IGBT, thus alternately turning on and off the IGBT.

The voltage controller controls a primary voltage across a primary coil of the transformer to control a value of the output voltage across the secondary coil accordingly. The drive circuit is capable of varying the rate of changing the IGBT between its switching states, i.e. on and off states, according to the controlled value of the output voltage across the secondary coil.

SUMMARY

If the output voltage across the secondary coil were directly applied as a power supply voltage to the on-off control terminal of a semiconductor switching element in the disclosed driving device, fluctuations of the output voltage across the secondary coil might have a negative impact on the control of varying the rate of changing the semiconductor switching element between its switching states. To reduce the negative impact, the disclosed driving device includes a regulator for regulating the power supply voltage corresponding to the output voltage across the secondary coil, and applies the regulated power supply voltage to the on-off control terminal of a semiconductor switching element.

Unfortunately, the regulator provided in the disclosed driving device may increase power loss by the regulator itself, and/or may increase the manufacturing cost of the disclosed driving device.

A first aspect of the present disclosure in view of the above circumstances aims to provide drivers for a semiconductor switching element, each of which is capable of varying the rate of changing the semiconductor switching element between its switching states with lower power loss and manufacturing cost. A second aspect of the present disclosure in view of the above circumstances aims to provide control systems for a power converter using such driving devices according to the so first aspect of the present disclosure.

A driving device according to a first exemplary aspect of the present disclosure is configured to change a semiconductor switching element, having an on-off control terminal, between an on state and an off state according to a power supply voltage input thereto. The driving device includes a constant-current driver configured to generate a constant current based on the power supply voltage. The constant-current driver is configured to perform at least one of charging and, discharging of the on-off control terminal of the semiconductor switching element using the generated constant current so as to change the semiconductor switching element from one of the on state and off state to the other thereof. The driving device includes a rate varying unit configured to adjust, based on correlation information between the power supply voltage and the constant current, a value of the constant current so as to vary a rate of changing the semiconductor switching element from one of the on state and the off state to the other thereof.

A control system according to a second exemplary aspect of the present disclosure is configured to control a buck-boost converter operating in a boosting mode to boost a first input voltage and in a bucking mode to reduce a second input voltage. The buck-boost converter includes a series-connection switch including an upper-arm semiconductor switching element and a lower-arm semiconductor switching element connected in series to each other. Each of the upper-arm semiconductor switching element and lower-arm semiconductor switching element has an on-off control terminal. The buck-boost converter includes an inductor connected to a connection point between the upper- and lower-arm semiconductor switching elements, and flywheel diodes connected antiparallel to the respective upper- and lower-arm semiconductor switching elements. The control system includes an upper-arm driving device provided for the upper-arm semiconductor switching element for changing the upper-arm semiconductor switching element between an on state and an off state according to a first power supply voltage input thereto. The control system includes a lower-arm driving device provided for the lower-arm semiconductor switching element for changing the lower-arm semiconductor switching element between an on state and an off state according to a second power supply voltage input thereto. Each of the upper-arm driving device and the lower-arm driving device includes a constant-current driver configured to generate a constant current based on a corresponding one of the first and second power supply voltages. The constant-current driver is configured to perform at least one of charging and discharging of the on-off control terminal of the semiconductor switching element using the generated constant current so as to change the semiconductor switching element from one of the on state and off state to the other thereof. Each of the upper-arm driving device and the lower-arm driving device includes a rate varying unit configured to adjust, based on correlation information between a corresponding one of the first and second power supply voltages and the constant current, a value of the constant current so as to vary a rate of changing the semiconductor switching element from one of the on state and the off state to the other thereof.

A control system according to a third exemplary aspect of the present disclosure is configured to control a power converter. The power converter includes a series-connection switch including an upper-arm semiconductor switching element and a lower-arm semiconductor switching element connected in series to each other. Each of the upper-arm semiconductor switching element and lower-arm semiconductor switching element has an on-off control terminal. The control system includes an upper-arm driving circuit provided for the upper-arm semiconductor switching element for changing the upper-arm semiconductor switching element between an on state and an off state according to a first power supply voltage input thereto. The control system includes a lower-arm driving circuit provided for the lower-arm semiconductor switching element for changing the lower-arm semiconductor switching element between an on state and an off state according to a second power supply voltage input thereto. Each of the upper-arm driving circuit and the lower-arm driving circuit includes a constant-current driver configured to generate a constant current based on a corresponding one of the first and second power supply voltages. The constant-current driver is configured to perform at least one of charging and discharging of the on-off control terminal of the semiconductor switching element using the generated constant current so as to change the semiconductor switching element from one of the on state and off state to the other thereof. Each of the upper-arm driving circuit and the lower-arm driving circuit includes a rate varying unit configured to adjust, based on correlation information between a corresponding one of the first and second power supply voltages and the constant current, a value of the constant current so as to vary a rate of changing the semiconductor switching element from one of the on state and the off state to the other thereof. The control system includes an isolated power supply system. The isolated power supply system includes a transformer including a primary coil and a secondary coil magnetically coupled to the primary coil and electrically isolated from the primary coil. The secondary coil is connected to the constant-current driver of each of the upper- and lower-arm driving circuits so that an output voltage across the secondary coil serves as the power supply voltage. The isolated power supply system includes an energization controller configured to control energization of the primary coil to adjust the output voltage across the secondary coil.

The driving device of the first exemplary aspect charges or discharges the on-off control terminal of the semiconductor switching element using the generated constant current to change the semiconductor switching state from one of the on state and the off state to the other thereof. This reduces adverse effects due to the fluctuations of the power supply voltage on the charging or discharging of the on-off control terminal of the semiconductor switching element.

Additionally, the driving device enables adjustment of a value of the constant current based on the correlation information to absorb the fluctuations of the power supply voltage, thus accurately varying the rate of changing the semiconductor switching element from one of the on state and the off state to the other thereof even if the power supply voltage fluctuates.

Similarly, each of the upper- and lower-arm driving devices or circuits according to the second aspect or the third aspect of the present disclosure reduces adverse effects due to the fluctuations of a corresponding one of the first and second power supply voltages on the charging or discharging of the on-off control terminal of a corresponding one of the upper- and lower-arm switching elements.

Additionally, each of the upper- and lower-arm driving devices or circuits according to the second aspect or the third aspect of the present disclosure enables adjustment of a value of the constant current based on the correlation information to absorb the fluctuations of a corresponding one of the first and second power supply voltages. This accurately varies the rate of changing a corresponding one of the upper- and lower-arm switching elements from one of the on state and the off state to the other thereof even if the power supply voltage fluctuates.

The above and/or other features, and/or advantages of various aspects of the present disclosure will be further appreciated in view of the following description in conjunction with the accompanying drawings. Various aspects of the present disclosure can include and/or exclude different features, and/or advantages where applicable. In addition, various aspects of the present disclosure can combine one or more feature of other embodiments where applicable. The descriptions of features, and/or advantages of particular embodiments should not be construed as limiting other embodiments or the claims.

BRIEF DESCRIPTION OF THE DRAWINGS

Other aspects of the present disclosure will become apparent from the following description of embodiments with reference to the accompanying drawings in which:

FIG. 4A is a table schematically illustrating how a control device illustrated in FIG. 1 and a rate varying unit illustrated in FIG. 3 operate according to the first embodiment;

FIG. 4B is a flowchart schematically illustrating an example of the sequence operations carried out by the control device and the rate varying unit according to the first embodiment;

FIG. 5 is a graph schematically illustrating an example of correlations between three sections of a use voltage range for a power supply voltage and corresponding three values of an output current from a first current-power source according to the first embodiment;

FIG. 7A is a table schematically illustrating how the control device and a rate varying unit illustrated in FIG. 6 operate according to the second embodiment;

FIG. 7B is a flowchart schematically illustrating an example of the sequence operations carried out by the control device and the rate varying unit according to the second embodiment;

FIG. 8 is a view schematically illustrating an example of modified information indicative of correlations between three sections of the use voltage range for the power supply voltage and corresponding three values of the output current from the first current-power source according to the second embodiment;

FIG. 12A is a table schematically illustrating how rate varying unite for the respective upper- and lower-arm booster switching elements operate in each of a power running mode and a regenerative mode according to the fourth embodiment;

FIG. 12B is a flowchart schematically illustrating an example of the sequence operations carried out by the control device and the rate varying unit for the upper-arm booster switching element in the power running mode according to the fourth embodiment;

FIG. 12C is a flowchart schematically illustrating an example of the sequence operations carried out by the control device and the rate varying unit for the upper-arm booster switching element in the regenerative mode according to the fourth embodiment;

DETAILED DESCRIPTION OF EMBODIMENT

Figure 1:
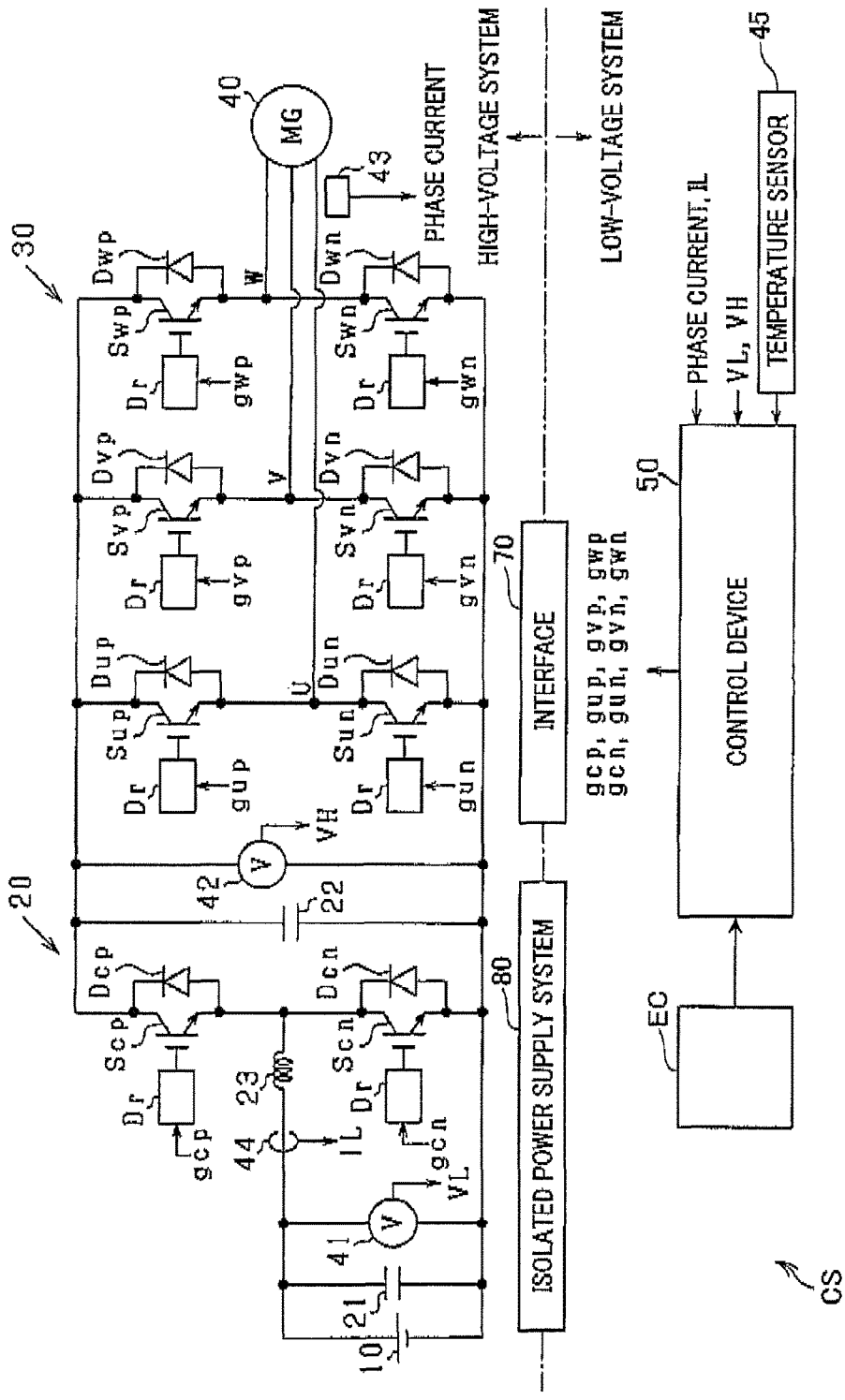
FIG. 1 is a circuit diagram schematically illustrating an example of the overall structure of a control system according to the first embodiment of the present disclosure.

The following describe specific embodiments of the present disclosure with reference to the accompanying drawings. The following omits or simplifies descriptions of like parts between the embodiments, to which like reference characters are assigned, thus eliminating redundant descriptions.

First Embodiment

First, the following describes a control system CS for a buck-boost converter 20 and an inverter 30 as examples of converters, to which a driving device for semiconductor switching elements according to the first embodiment of the present disclosure has been applied, with reference to FIGS. 1 to 5.

The control system CS is installed in a vehicle equipped with an MG 40 as a main engine for moving the vehicle.

Referring to FIG. 1, the control system CS includes the buck-boost converter 20, the inverter 30, the MG 40, drive circuits Dr, a control device 50, an interface 70, and an isolated power supply system 80.

The MO 40 includes a rotor and a stator, and the rotor is directly or indirectly coupled to driving wheels of the vehicle. The MG 40 is able to transfer power to the driving wheels of the vehicle. The MG 40 is electrically connected to a high-voltage battery 10 via the buck-boost converter 20 and the inverter 30. The first embodiment uses a three-phase MO as the MG 40.

The stator of the MG 40 includes three-phase windings connected to the inverter 30. The MO 40 serves as both a motor and a power generator. When serving as a motor, the MG 40 provides rotation to the driving wheels via the motor, thus moving the vehicle. When serving as a power generator, the MG 40 generates electrical power to charge the high-voltage battery 10 via the inverter 30 and the buck-boost converter 20 and/or to be supplied to electrical components installed in the vehicle.

For example, the MG 40 is designed as a three-phase permanent magnet synchronous motor.

The first embodiment uses, as the high-voltage battery 10, a rechargeable battery, such as a lithium-ion battery or a nickel-hydrogen battery, which has a terminal voltage equal to or higher than 100 V.

The buck-boost converter 20 includes a first capacitor 21, a second capacitor 22, an inductor, i.e. a reactor, 23, and a series-connection switch comprised of an upper-arm booster switching element Scp, a lower-arm booster switching element Scn connected in series to each other. The buck-boost converter 20 also includes a flywheel diode Dcp and a flywheel diode Dcn.

The first capacitor 21, which has first and second ends, i.e. first and second electrodes, facing each other, is connected in parallel to the high-voltage battery 10. The first end of the first capacitor 21 is connected to the connection point between the switching elements Scp and Scn via the inductor 23. The second capacitor 22 is connected in parallel to the series-connection switch. The flywheel diode Dcp is connected in antiparallel to the upper-arm booster switching element Scp, and the flywheel diode Dcn is connected in antiparallel to the lower-am booster switching element Scn.

For example, the first embodiment uses IGBTs, as an example of voltage-controlled switching elements, as the upper- and lower-arm booster switching elements Scp and Scn. If MOSFETs are individually used as the upper- and lower-arm booster switching elements Scp and Scn, intrinsic diodes of the MOSFETs can be used as the flywheel diodes.

Specifically, the emitter, i.e. an output terminal, of the upper-arm booster switching element Scp is connected to the collector, i.e. an input terminal, of the lower-arm booster switching element Scn to constitute the series-connection switch. The collector of the upper-arm booster switching element Scp is connected to a positive terminal of the inverter 30. The emitter of the lower-arm booster switching element Scn is connected to a negative terminal of the inverter 30. The gates, i.e. the on-off control terminals, of the upper- and lower-arm booster switching elements Scp and Scn are individually connected to the corresponding drive circuits Dr.

The inverter 20 can operate in a power running mode to output an alternating-current (AC) voltage to the MG 40, and a regenerative mode to convert an AC voltage output from the MG 40 to a DC voltage and output the DC voltage to the buck-boost converter 20.

Complementary, i.e. alternate, switching of the upper- and lower-arm booster switching elements Scp and Scn of the buck-boost converter 20 while the inverter 30 is operating in the power running mode boosts a direct-current (DC) voltage output from the high-voltage battery 10 to a desired voltage. The boosted voltage is output from the buck-boost converter 20 to the inverter 30.

Complementary, i.e. alternate, switching of the upper- and lower-arm booster switching elements Scp and Scn of the buck-boost converter 20 while the inverter 30 is operating in the regenerative mode steps down the DC voltage output from the inverter 30, and outputs the stepped-down DC voltage to the high-voltage battery 10.

The inverter 30 is a three-phase inverter. The inverter 30 includes

1. A first series-connection switch comprised of a first pair of U-phase upper- and lower-arm switching elements Sup and Sun connected in series to each other 2. A second series-connection switch comprised of a second pair of V-phase upper- and lower-arm switching elements Svp and Svn connected in series to each other 3. A third series-connection switch comprised of a third pair of W-phase upper- and lower-arm switching elements Swp and Swn connected in series to each other.

The first to third series-connection switches are connected in parallel to each other. The connection point between the upper- and lower-arm switches Sup and Sun of the first series-connection switch is connected to a first end of the U-phase winding. Similarly, the connection point between the upper- and lower-arm switches Svp and Svn of the second series-connection switch is connected to a first end of the V-phase winding, and the connection point between the upper- and lower-arm switches Swp and Swn of the third series-connection switch is connected to a first end of the W-phase winding. Second ends of the U-, V-, and W-phase windings are connected to each other. That is, the three-phase windings are connected to each other in star connection. The three-phase windings can be connected to each other in delta connection, and the three-phase windings in the delta connection can be connected to the connection points of the respective first, second, and third series-connection switches.

For example, the first embodiment uses an IGBT, as an example of voltage-controlled switching elements, as each of the upper- and lower-arm switching elements S*#(*=U, V, W, #=p, n). The inverter 30 includes flywheel diodes D*#. Each of the flywheel diodes D*# is connected in antiparallel to a corresponding one of the switching elements S*#. If MOSFETs are individually used as the upper- and lower-arm switching elements of the inverter 30, intrinsic diodes of the MOSFETs can be used as the flywheel diodes.

Specifically, the emitter of each of the upper-arm switching elements S*p is connected to the collector of the corresponding one of the lower-arm switching elements S*n to constitute a corresponding one of the series-connection switches. The collectors of the upper-arm switching elements S*p are connected to constitute the positive terminal of the inverter 30, which is connected to the collector of the upper-arm booster switching element Scp. The emitters of the lower-arm switching elements S*n are connected to constitute the negative terminal of the inverter 30, which is connected to the emitter of the lower-arm booster switching element Scn. The gates, i.e. the on-off control terminals, of the upper- and lower-arm switching elements S*# are individually connected to the corresponding drive circuits Dr. Note that the inverter 30 can include the second capacitor 22 in place of the buck-boost converter 20.

The control system CS also includes a first voltage sensor 41, a second voltage sensor 42, a phase-current sensor 43, an inductor-current sensor 44, and a coolant temperature sensor 45.

The first voltage sensor 41, which serves as, for example, a first voltage detector, measures the voltage, referred to as a first voltage VL, across the first capacitor 21, and outputs a measurement signal indicative of the first voltage VL across the first capacitor 21 to the control device 50. The second voltage sensor 42, which serves as, for example, a second voltage detector, measures the voltage, referred to as a second voltage VH, across the second capacitor 22, and outputs a measurement signal indicative of the second voltage VH across the second capacitor 22 to the control device 50.

The phase-current sensor 43, which serves as, for example, a phase-current detector, measures phase currents flowing through at least two-phase windings in the three-phase windings of the MG 40, and outputs, to the control device 50, measurement signals indicative of the phase currents flowing through the at least two-phase windings. The at least two-phase currents are currents in a three-phase (UVW) stationary coordinate system at rest defined in the stator of the MG 40.

The inductor-current sensor 44 measures a current flowing through the inductor 23, and outputs a measurement signal indicative of the current flowing through the inductor 23 to the control device 50.

Each of the buck-boost converter 20 and the inverter 30 is configured such that an unillustrated coolant is circulated in the corresponding one of the buck-boost converter 20 and the inverter 30 to cool the components of the corresponding one of the buck-boost converter 20 and the inverter 30. In particular, the temperature of the coolant correlates with the temperature of each of the switching elements Scp, Scn, and S*#. The coolant temperature sensor 45 measures the temperature of the coolant, and outputs a measurement signal indicative of the temperature of the coolant to the control device 50. For example, the measurement signals output from the above sensors 41, 42, 43, and 44 are sent to the control device 50 via, for example, the interface 70.

For example, the control device 50 is essentially comprised of a microcomputer circuit. The control device 50 is connected to an external so control circuit EC for inputting, to the control device 50, request torque as an example of request values for one of the controlled variables for the MG 40. For example, the first embodiment uses an electronic control unit (ECU) installed in the vehicle, which is higher in hierarchy than the control device 50, as the external control circuit EC if the controllers are arranged in a hierarchical relationship.

The control device 50 controls the buck-boost converter 20 and the inverter 30 to adjust one of the controlled variables of the MG 40, i.e. the output torque, of the MG 40 to the request value, i.e. the request torque, for the MG 40.

Specifically, the control device 50 generates drive signals gcp and gcn for selectively turning on and off the respective booster switching elements Scp and Scn of the buck-boost converter 20 according to the received measurement signals and the request torque. Then, the control device 50 outputs the drive signals gcp and gcn to the drive circuits Dr provided for the respective switching elements Scp and Scn. The drive circuits Dr controls on and off operations of the switching elements Scp and Scn according to the respective drive signals gcp and gcn. For example, the drive signals gcp and gcn according to the first embodiment are determined to alternately turn on and off the lower-arm booster switching element Scn while the inverter 30 is operating in the power running mode. The drive signals Scp and Scn according to the first embodiment are also determined to alternately turn on and off the upper-arm booster switching element Scp while the inverter 30 is operating in the regenerative mode.

The control device 50 also generates drive signals g*# for selectively turning on and off the respective switching elements S*# of the inverter 30 according to the received measurement signals and the request torque. Then, the control device 50 outputs the drive signals g*# to the drive circuits Dr provided for the respective switching elements S*#. The drive circuits Dr controls on and off operations of each of the switching elements S*# according to a corresponding one of the drive signals g*#. In particular, the drive signal g*p for the upper-arm switching element S*p and the drive signal g*n for the corresponding lower-arm switching element S*n are determined to complementarily turn on and off the corresponding switching elements S*p and S*n. That is, the drive signal g*p for the upper-arm switching element S*p and the drive signal g*n for the corresponding lower-arm switching element S*n are determined to alternately turn on the corresponding switching elements S*p and S*n.

The interface 70 and the isolated power supply system 80 enable a high-voltage system comprised of the high-voltage battery 10, the buck-boost converter 20, each drive circuit Dr, the inverter 30, and the MG 40 to be electrically isolated from a low-voltage system comprised of the control device 50. The low-voltage system serves as, for example, a first voltage system, and the high-voltage system serves as, for example, a second voltage system.

The interface 70 includes photocouplers 70a (see FIG. 2) as an example of electrical isolators provided for the respective switching elements Sc# and S*#. Specifically, each of the photocouplers 70a is configured to enable the control device 50 to control each of the corresponding one of the switching elements Sc# and S1*# while establishing electrical isolation between the control device 50 and a corresponding one of the switching elements Sc# and S*#.

For example, the high voltage system has a reference voltage level, i.e. a reference potential, to which the potential at the negative terminal of the high-voltage battery 10 is set. For example, the low voltage system has a reference voltage level, i.e. a reference potential, to which the intermediate potential between the potential at the positive terminal of the high-voltage battery 10 and that at the negative terminal thereof is set; the intermediate potential is set to the potential at the body of the vehicle.

Figure 2:
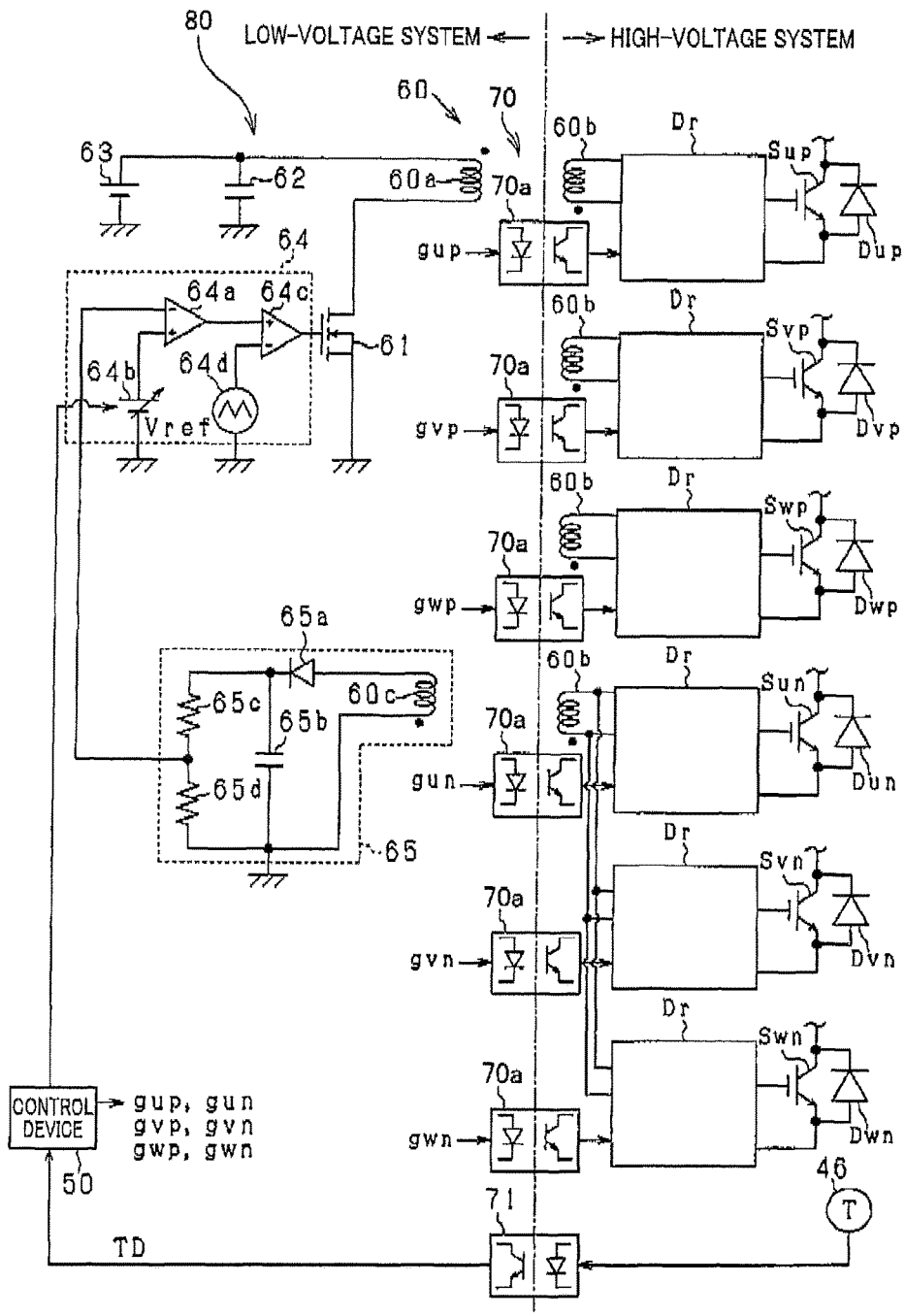
FIG. 2 is a circuit diagram schematically illustrating an example of the circuit structure of an isolated power supply system illustrated in FIG. 1.

Next, the following describes an example of the structure of the isolated power supply system 80 that enables power to be supplied from the low voltage system to each drive circuit Dr of the high voltage system while electrically isolating the low voltage system from the high voltage system with reference to FIG. 2. Note that illustration of the drive circuits Dr for the booster switching elements Scp and Scn are omitted in FIG. 2 to simplify the illustration of the structure of the isolated power supply system 80.

Referring to FIG. 2, the isolated power supply system 80, which serves as a flyback switching power supply, includes a transformer 60, an N-channel MOSFET, referred to as a control switching element, 61, a capacitor 62, a low-voltage battery 63, a voltage controller 64, and a voltage detector 65.

The transformer 60 includes a primary winding 60a and a plurality of secondary coils 60b. For example, five secondary coils 60b are connected to the corresponding drive circuits Dr provided for the respective switching elements Scp, Scn, Sup, Svp, and Swp. A common secondary coil 60b is commonly connected to the drive circuits Dr provided for the respective lower-arm switching elements Sun, Svn, and Swn. The primary coil 60a is magnetically coupled to the secondary coils 60b while electrically isolating the primary coil 60a from the secondary coils 60b. The turn ratio representing the number of turns of each of the secondary coils 60b to the number of turns of the primary coil 60a is set to a predetermined value. This enables the voltage across the primary coil 60a to be changed to a voltage across each secondary coil 60b based on the turn ratio.

The primary coil 60a has a first end and a second end opposite to the first end. The first end of the primary coil 60a is connected to a positive terminal of the low-voltage battery 63, and the second end of the primary coil 60a is connected to the drain, i.e. an input terminal, of the control switching element 61 to constitute a series-connection member. The source, i.e. an output terminal, of the control switching element 61 is connected to a common ground, so that the low-voltage battery 63 is connected in parallel to the series-connection member. The capacitor 62 is also connected in parallel to the series-connection member. That is, the low-voltage battery 63, the capacitor 62, the primary coil 60a, and the series-connection member constitute a loop circuit, and the control switching element 61 is capable of opening or closing the loop circuit.

The low-voltage battery 63 supplies an output voltage to the control device 50 so that the control device 50 operates based on the supplied output voltage. The first embodiment uses, as the low-voltage battery 63, a rechargeable battery, such as a nickel-hydrogen battery, which has a terminal voltage, i.e. the output voltage, lower than the terminal voltage of the high-voltage battery 10.

The voltage detector 65 includes a detection coil 60c, a detection diode 65a, a detection capacitor 65b, a first resistor 65c, and a second resistor 65d.

The detection coil 60c is located to be magnetically coupled to at least one of the secondary coils 60b of the transformer 60 while electrically isolating the detection coil 60c from each of the secondary coils 60b. The turn ratio representing the number of turns of each of the secondary coils 60b to the number of turns of the detection coil 60c is set to a predetermined value. This enables the voltage across the detection coil 60c to show a voltage across each secondary coil 60b based on the turn ratio.

The detection coil 60c has opposing first and second ends, and the first end of the detection coil 65 is connected to the anode of the detection diode 65a, and the second end of the detection coil 60c is connected to the common ground of the low voltage system. The detection capacitor 65b has opposing first and second ends, i.e. first and second electrodes, and the first end of the detection capacitor 65b is connected to the cathode of the detection diode 65a, and the second end of the detection capacitor 65b is connected to the common ground. That is, the detection capacitor 65b is connected in parallel to the detection coil 60c via the detection diode 65a.

The first and second resistors 65c and 65d are connected in series to each other to constitute a series connection resistance member. The series-connection resistance member is connected in parallel to the detection capacitor 65b. That is, the series-connection resistance member has opposing first and second ends, and the first end of the series-connection resistance member is connected to the first end of the detection capacitor 65b, and the second end of the series-connection resistance member is connected to the common ground. The connection point between the first and second resistors 65c and 65d is connected to the voltage controller 64.

The voltage across the detection coil 60c and the turn ratio between the detection coil 60c and each secondary coil 60b indirectly represent the voltage across the secondary coil 50b. The voltage across the detection coil 60c, i.e. the voltage across the detection capacitor 65b, is divided by the first and second resistors 65c and 65d as a voltage at the connection point between the first and second resistors 65c and 65d. That is, the voltage at the connection point between the first and second resistors 65c and 65d shows the voltage across each of the secondary coils 60b. In other words, the voltage detector 65 detects the voltage, i.e. the output voltage, across each of the secondary coils 60b as the voltage at the connection point between the first and second resistors 65c and 65d.

The voltage controller 64 is operative to control, based on the voltage detected by the voltage detector 65, a variable duty, i.e. a duty factor, for each predetermined switching period for the control switching element 61. The duty factor represents a predetermined ratio, i.e. percentage, of an on duration to the total duration of the control switching element 61 for each predetermined switching period. Controlling the duty factor of the control switching element 61 performs feedback control of the output voltage across each of the secondary coils 60b of the transformer 60.

Specifically, the voltage controller 64 includes an error amplifier 64a, a reference power source 64b, a PWM comparator 64c, and a carrier-signal generator 64d.

The error amplifier 64a has a non-inverting input terminal, an inverting input terminal, and an output terminal. The inverting input terminal of the error amplifier 64a is connected to the connection point between the first and second resistors 65c and 65d. The non-inverting input terminal of the error amplifier 64a is connected to a positive terminal of the reference power source 64b. A negative terminal of the reference power source 64b is connected to the common ground. The PWM comparator 64c has a non-inverting input terminal, an Inverting input terminal, and an output terminal. The non-inverting input terminal of the PWM comparator 64c is connected to the output terminal of the error amplifier 64a. The inverting input terminal of the PWM comparator 64c is connected to the carrier-signal generator 64d. The output terminal of the PWM comparator 64c is connected to the gate of the control switching element 61.

The voltage detected by the voltage detector 65, i.e. the voltage correlating with the voltage across each of the secondary coils 60b, is input to the inverting input terminal of the error amplifier 64a. The reference power source 64d outputs a variable reference voltage Vref that is input to the non-inverting input terminal of the error amplifier 64a. An error output signal of the error amplifier 64a, which shows the difference, i.e. the error, from the reference voltage Vref and the voltage detected by the voltage detector 65, is input to the non-inverting input terminal of the PWM comparator 64c.

The carrier-signal generator 64d generates a periodic triangular voltage signal TS as a reference voltage signal, and outputs the generated periodic triangular voltage signal to the inverting input terminal of the PWM comparator 64c.

The PWM comparator 64c compares the level of the error voltage signal with the periodic triangular voltage signal, and outputs, according to the results of the comparison, a PWM signal consisting of a train of pulses having a variable duty, i.e. a duty factor, for a predetermined switching period. The duty factor represents a predetermined ratio, i.e. percentage, of on duration to the total duration of the control switching element 61 for each predetermined switching period. The PWM signal is input to the gate of the control switching element 61.

This configuration of the voltage controller 64 alternately turns on and off the control switching element 61 based on the PWM signal to thereby adjust the error output voltage of the error amplifier 64a to be zero. In other words, this configuration of the voltage controller 64 controls energization, i.e. energization or de-energization, of the primary coil 60a through the loop circuit including the control switching element 61 based on the on-off switching operations of the control switching element 61.

This controls the voltage across the primary coil voltage 60a based on the on-off switching operations of the control switching element 61, thus adjusting the output voltage across each of the secondary coils 60b to a target voltage determined based on the reference voltage Vref. For example, at least the control device 50, the control switching element 61, the low-voltage battery 63, and the voltage controller 64 serve as an energization controller.

As described above, the drive signals gcp and gcn, which are generated by the control device 50, are input to the corresponding drive circuits Dr provided for the respective switching elements Scp and Scn via so the corresponding photocouplers 70a. Similarly, the drive signals g*#, which are generated by the control device 50, are input to the corresponding drive circuits Dr provided for the respective switching elements S*# via the corresponding photocouplers 70a.

Additionally, the control system CS includes a temperature sensor 46 provided for at least one of the switching elements S*# in the inverter 30 of the high-voltage system and configured to measure the temperature of the at least one of the switching elements S*#. For example, the temperature sensor 46 is comprised of a temperature-sensitive diode and located to be close to the at least one of the switching elements S*#. The temperature sensor 46 according to the first embodiment is for example located to be close to the selected one of the switching elements S*#; the selected switching element is expected to have the highest temperature in all the switching elements S*#. For example, the temperature sensor 46 according to the first embodiment is located to be close to the W-phase lower-arm switching element Swn as an example. The temperature sensor 46 measures the temperature of the W-phase lower-arm switching element Swn, and outputs a measurement signal TD indicative of the temperature, referred to as a measured temperature TD, of the W-phase lower-arm switching element Swn to the control device 50 via an electrical isolator of, for example, a photocoupler 71 included in the interface 70.

Next, the following describes an example of the structure of each of the drive circuits Dr provided for the respective switching elements Scp, Scn, and S*#. The drive circuits Dr provided for the respective switching elements Scp, Scn, and S*# intrinsically have identical structures, so that the following describes the structure of the drive circuit Dr provided for the U-phase upper-arm switching Sup as an example with reference to FIG. 3.

Figure 3:
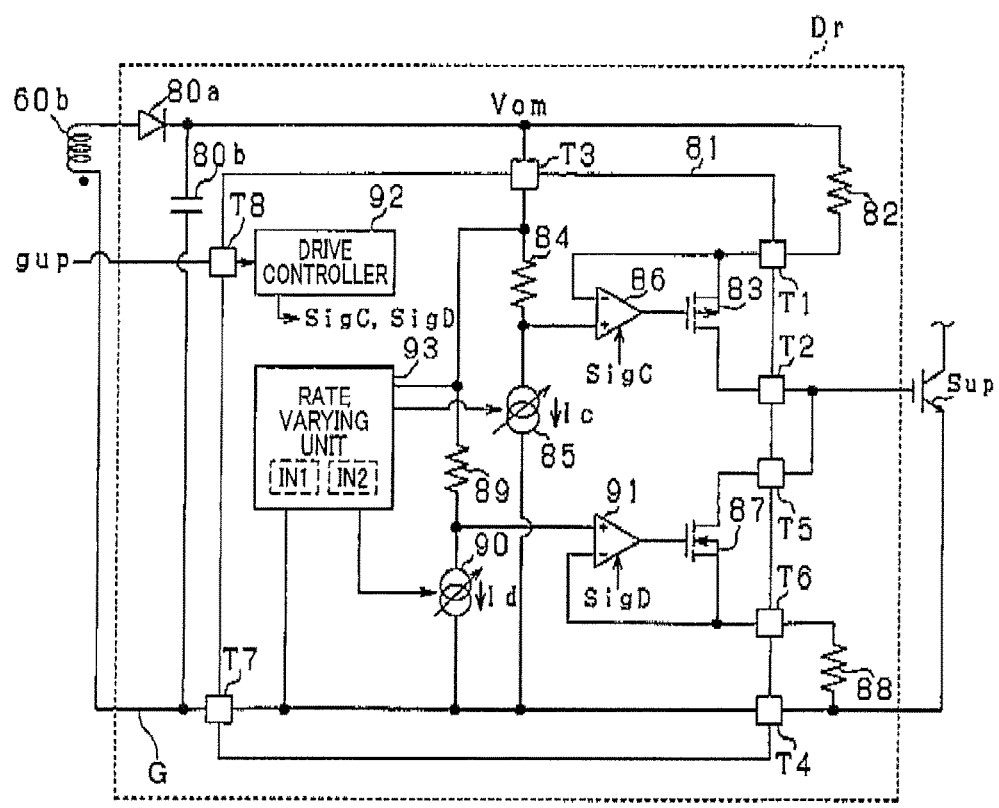
FIG. 3 is a circuit diagram schematically illustrating an example of the circuit structure of a driver circuit illustrated in FIG. 1.

Referring to FIG. 3, the drive circuit Dr provided for the U-phase switching element Sup includes a secondary diode 80a, a secondary capacitor 80b, an integrated circuit (IC) 81, a charging resistor 82, and a discharging resistor 88.

The IC 81 has, for example, first to eighth terminals T1 to T8. The IC 81 includes, for example, a charging switching element 83, a first adjustment resistor 84, a first constant-current source 85, a first operational amplifier 86, a discharging switching element 87, a discharging resistor 88, a second adjustment resistor 89, a second constant-current source 90, and a second operational amplifier 91. The first embodiment for example uses a P-channel MOSFET as the charging switching element 83, and uses an N-channel MOSFET as the discharging switching element 87.

Each of the secondary coil 60b has opposing first and second ends. The first end of the secondary coil 60b is connected to the anode of the secondary diode 80a, and the second end of the secondary coil 60b is connected to the seventh terminal T7 provided on a common ground G of the drive circuit Dr. The secondary capacitor 80b has opposing first and second ends, i.e. first and second electrodes. The first end of the secondary capacitor 80b is connected to the cathode of the secondary diode 80a, and the second end of the secondary capacitor 80b is connected to the common ground G via the seventh terminal T7. The cathode of the secondary diode 80a is also connected to the first terminal T1 of the IC 81 via the charging resistor 82. The source of the charging switching element 83 is connected to the first terminal T1. The drain of the charging switching element 83 is connected to the second terminal T2, and, to the second terminal T2, the gate of the U-phase upper-arm switching element Sup is connected. That is, the gate of the U-phase upper-arm switching element Sup is connected to the first terminal T1 via the charging switching element 83 and the second terminal T2.

The first adjustment resistor 84 has opposing first and second ends. The first end of the first adjustment resistor 84 is connected to the cathode of the secondary diode 80a via the third terminal T3. The second end of the first adjustment resistor 84 is connected to the common ground G via the fourth terminal T4 and the first constant-current source 85. That is, the fourth and seventh terminals T4 and T7 serve as ground terminals provided on the common ground G of the drive circuit Dr. The emitter of the switching element Sup is connected to the common ground G via the fourth terminal T4.

The first operational amplifier 86, which serves as, for example, a comparator driver, has a non-inverting input terminal, an inverting input terminal, an output terminal, and an enable-signal terminal. The non-inverting input terminal of the first operational amplifier 86 is connected to the connection point between the first constant-current source 85 and the first adjustment resistor 84. The inverting input terminal of the first operational amplifier 86 is connected to the first terminal T1. The output terminal of the first operational amplifier 86 is connected to the gate of the charging switching element 83.

Specifically, the first operational amplifier 86 is configured such that the two inputs are virtually short-circuited via the charging switching element 83 while the first operational amplifier 86 is operating by an enable signal SigC being input to the enable terminal thereof. For this reason, the first operational amplifier 86 is configured to drive the charging switching element 83, so that the potential at the first terminal T1 is maintained at the potential at the connection point between the first adjustment resistor 84 and the constant-current source 85.

That is, when activated, the virtually short-circuited first operational amplifier 86 turns on or off the charging switching element 83 as a variable resistor, thus matching the potential at the first terminal T1 with the potential at the connection point between the first adjustment resistor 84 and the constant-current source 85. This makes it possible to supply a constant charging current to the gate of the switching element Sup.

These operations of the first operational amplifier 86 and the charging switching element 83 serve as a charging task of the gate of the switching element Sup.

This configuration enables the voltage at the first terminal T1 to be clamped to the voltage at the connection point between the first constant-current source 85 and the first adjustment resistor 84. This maintains the charging current to the gate of the switching element Sup at a constant value determined based on the output voltage across the secondary coil 60b, the resistance of the first adjustment resistor 85, and the output current Ic from the first constant-current source 85.

The charging resistor 82, the charging switching element 83, the first adjustment resistor 84, the first constant-current source 85, and the first operational amplifier 86 serve as, for example, a charging unit of a constant-current driver for charging the gate of the corresponding switching element.

The gate of the switching element Sup is also connected to the fifth terminal T5. The drain of the discharging switching element 87 is connected to the fifth terminal T5. The source of the discharging switching element 87 is connected to the sixth terminal T6. The discharging resistor 88 has opposing first and second ends. The first end of the discharging resistor 88 is connected to the sixth terminal T6, and the second end of the discharging resistor T6 is connected to the common ground G via the fourth terminal T4. That is, the gate of the switching element Sup is connected to the sixth terminal T6 via the fifth terminal T5 and the discharging switching element 87.

The second adjustment resistor 89 has opposing first and second ends. The first end of the second adjustment resistor 89 is connected to the cathode of the secondary diode 80a via the third terminal T3. The second end of the second adjustment resistor 89 is connected to the common ground G via the fourth terminal T4 and the second constant-current source 90.

The second operational amplifier 91 has a non-inverting input terminal, an inverting input terminal, an output terminal, and an enable-signal terminal. The non-inverting input terminal of the second operational amplifier 91 is connected to the connection point between the second constant-current source 90 and the second adjustment resistor 89. The inverting input terminal of the second operational amplifier 91 is connected to the sixth terminal T6. The output terminal of the second operational amplifier 91 is connected to the gate of the discharging switching element 87. Note that whether an enable signal SigD is input to the enable-signal terminal of the second operational amplifier 91 enables the second operational amplifier 91 to be activated or deactivated.

Specifically, the second operational amplifier 91 is configured such that the two inputs are virtually short-circuited via the discharging switching element 87 while the second operational amplifier 91 is operating by an enable signal SigD being input to the enable terminal thereof. For this reason, the second operational amplifier 91 is configured to drive the discharging switching element 87, so that the potential at the sixth terminal T6 is maintained at the potential at the connection point between the second adjustment resistor 89 and the second constant-current source 90.

That is, when activated, the virtually short-circuited second operational amplifier 91 turns on or off the discharging switching element 87 as a variable resistor, thus matching the potential at the sixth terminal T6 with the potential at the connection point between the second adjustment resistor 89 and the second constant-current source 90. This makes it possible to cause a constant discharging current to flow from the gate of the switching element Sup.

These operations of the second operational amplifier 91 and the discharging switching element 87 serve as a discharging task of the gate of the switching element Sup.

This configuration enables the voltage at the sixth terminal T6 to be clamped to the voltage at the connection point between the second constant-current source 90 and the second adjustment resistor 89. This maintains the discharging current from the gate of the switching element Sup at a constant value determined based on the output voltage across the secondary coil 60b, the resistance of the second adjustment resistor 89, and the output current Id from the second constant-current source 90.

The discharging switching element 87, the discharging resistor 88, the second adjustment resistor 89, the second constant-current source 90, and the second operational amplifier 91 serve as, for example, a discharging unit of a constant-current driver for discharging the gate of the corresponding switching element.

The IC 81 also includes a drive controller 92 connected to the eighth terminal T8, and the enable-signal terminals of the respective first and second operational amplifiers 86 and 91. The drive controller 92 is configured to alternately perform, according to the drive signal gup input thereto via the eighth terminal T8, the charging task and the discharging task set forth above.

Specifically, the drive controller 92 outputs the enable signal SigC to the first operational amplifier 86 to activate the first operational amplifier 86, and stops the output of the enable signal SigD to the second operational amplifier 91 to deactivate the second operational amplifier 91. This performs the charging task based on the operations of the first operational amplifier 86 and the charging switching element 83.

In contrast, the drive controller 92 outputs the enable signal SigD to the second operational amplifier 91 to activate the second operational amplifier 91, and stops the output of the enable signal SigC to the first operational amplifier 86 to deactivate the first operational amplifier 86. This performs the discharging task based on the operations of the second operational amplifier 91 and the discharging switching element 87.

The IC 81 also includes a rate varying unit 93. The rate varying unit 93 is connected to the connection point between the third terminal T3 and the first end of the first adjustment resistor 84, to the connection point between the third terminal T3 and the first end of the second adjustment resistor 89, and to the common ground G. This connection enables the rate varying unit 93 to measure the output voltage across the secondary coil 60b as a power supply voltage Vom. The rate varying unit 93 is also controllably connected to each of the first and second constant-current sources 85 and 90. In other words, a value of an output current, i.e. a constant current, Ic from the first constant-current source 85 and a value of an output current, i.e. a constant current, Id from the second constant-current source 95 can be varied by the rate varying unit 93.

The control device 50 and the rate varying unit 93 are capable of cooperatively varying, based on the measured power supply voltage Vom, the rate of changing, i.e. switching, the switching element Sup from the off state to the on state, and the rate of changing the switching element Sup from the on state to the off state. A switching-state changing rate CR of the switching element Sup described hereinafter includes both the rate of changing the switching element Sup from the off state to the on state, and the rate of changing the switching element Sup from the on state to the off state.

Referring to FIG. 4A, the control device 50 and the rate varying unit 93 adjust the switching-state changing rate CR according to change of various parameters correlating with the operating conditions of the switching element Sup.

Specifically, the control device 50 and the rate varying unit 93 adjust the switching-state changing rate CR such that the switching-state changing rate CR decreases with an increase of the second voltage VH, across the second capacitor 22. The second voltage VH changes with the collector voltage at the collector of the switching element Sup. Skilled persons in the technical field know that the higher the collector voltage of a semiconductor switching element is, the higher the sum of the collector-emitter voltage of the semiconductor switching element and a surge generated based on the switching-stage changing of the semiconductor switching element is. In view of these circumstances, the adjustment reduces the switching-state changing rate CR as the second voltage VH increases.

Referring to FIG. 4A, the control device 50 and the rate varying unit 93 adjust the switching-state changing rate CR such that the switching-state changing rate CR decreases with a decrease of the measured temperature TD. Skilled persons in the technical field know that the higher the temperature of a semiconductor switching element is, the lower the withstand voltage of the semiconductor switching element is. In view of these circumstances, the adjustment reduces the switching-state changing rate CR as the measured temperature TD drops.

Referring to FIG. 4A, the control device 50 and the rate varying unit 93 adjust the switching-state changing rate CR such that the switching-state changing rate decreases with an increase of a value of the current Is flowing through the switching element Sup. The control device 50 is able to obtain the value of the current Is flowing through the switching element Sup according to the measurement signals output from the phase-current sensor 43.

Skilled persons in the technical field know that the higher the value of the current Is flowing through a semiconductor switching element is, the higher a surge generated based on the switching-state changing of the semiconductor switching element is. In view of these circumstances, the adjustment reduces the switching-state changing rate CR as the value of the current Is flowing through the switching element Sup decreases. For example, the control device 50 can use, as the value of the current Is flowing through the switching element Sup, the amplitude of the corresponding U-phase current flowing through the U-phase winding of the MG 40 or the amplitude of a current vector in a known d-q coordinate system, i.e. a two-phase rotating coordinate system, defined relative to the rotor of the MG 40. That is, the control device 50 is capable of calculating the amplitude of the corresponding U-phase current and the amplitude of the current vector according to the measurement signals output from the phase-current sensor 43.

For example, the control device 50 variably determines a target switching-state changing rate TCR for the switching-state changing rate CR according to the second voltage VH, the measured temperature TD, and the value of the current Is flowing through the switching element Sup in step S1 of FIG. 4B. Then, the control device 50 adjusts the reference voltage vref of the reference power source 64b such that (1) The reference voltage Vref increases with an increase of the target switching-state changing rate TCR (2) The reference voltage Vref decreases with a decrease of the target switching-state changing rate TCR in step S2 (see FIG. 4A).

This increase or decrease of the reference voltage Vref enables the power supply voltage Vom to be adjusted to increase or decrease in step S2.

The rate varying unit 93 adjusts the output current Ic from the first constant-current source 85 or the output current Id from the second constant-current source 90 according to change of the power supply voltage Vom in step S3.

Specifically, the rate varying unit 93 stores beforehand first information IN1 indicative of the correlations between the power supply voltage Vom and the output current Ic from the first constant-current source 85. For example, the rate varying unit 93 stores, as the first information IN1, information configured such that, the higher the power supply voltage Vom is, the higher the output current Ic is.

In addition, the rate varying unit 93 stores beforehand second information IN2 indicative of the correlations between the power supply voltage Vom and the output current Id from the second constant-current source 90. For example, the rate varying unit 93 stores, as the second information IN2, information configured such that, the higher the power supply voltage Vom is, the lower the output current Id is.

As described above, an increase of the second voltage VH, a decrease of the measured temperature TD, or an increase of the value of the current Is flowing through the switching element Sup causes the control device 50 to reduce the target switching-state changing rate TCR. This causes the control device 50 to reduce the reference voltage Vref, so that the output voltage across the secondary coil 60b, i.e. the power supply voltage Vom, decreases.

This causes the rate varying unit 93 of the drive circuit Dr to (1) Decrease the output current Ic with the decrease of the power supply voltage Vom so as to reduce the switching-state changing rate when the drive circuit Dr changes the switching element Sup from the off state to the on state (2) Increase the output current Id with the decrease of the power supply voltage Vom so as to reduce the switching-state changing rate when the drive circuit Dr changes the switching element Sup from the on state to the off state.

Decreasing the output current Ic from the first constant-current source 85 enables the voltage at the first terminal T1, which corresponds to the voltage input to the inverting input terminal of the first operational amplifier 86, to increase, so that the charging current flowing through the charging resistor 82 to the gate of the switching element Sup decreases. This results in reduction of the switching-state changing rate of the switching element Sup from the off state to the on state.

Increasing the output current Id from the second constant-current source 90 enables the voltage at the sixth terminal T6, which corresponds to the voltage input to the inverting input terminal of the second operational amplifier 91, to decrease, so that the discharging current flowing through the discharging resistor 88 from the gate of the switching element Sup decreases. This results in reduction of the switching-state changing rate of the switching element Sup from the on state to the off state.

Of course, the rate varying unit 93 of the drive circuit Dr increases the output current Ic with an increase of the power supply voltage Vom so as to increase the switching-state changing rate when the drive circuit Dr changes the switching element Sup from the off state to the on state. Similarly, the rate varying unit 93 of the drive circuit Dr decreases the output current Id with an increase of the power supply voltage Vom so as to increase the switching-state changing rate when the drive circuit Dr changes the switching element Sup from the on state to the off state.

Each of the other drive circuits Dr provided for the other switching elements Scp, Scn, Sun, Svp, Svn, Swp, and Swn also has the above configuration of the drive circuit Dr provided for the switching Sup. This enables the switching-state changing rate of a corresponding one of the switching elements Scp, Scn, Sun, Svp, Svn, Swp, and Swn to increase or decrease. Note that, when adjusting the switching-state changing rate of the switching element Scp or Scn, the control device 50 can obtain the current Is flowing through the switching element Scp or Scn according to the measurement signal indicative of the current flowing through the inductor 23 and output from the inductor-current sensor 44. In addition, when adjusting the switching-state changing rate of the switching element Scn, the control device 50 can use, as one of the parameters for varying the switching-state changing rate of the switching element Scn, the first voltage VL measured by the first voltage sensor 41 in place of the second voltage VH.

The rate varying unit 93 can be configured to stepwisely vary the switching-state changing rate of the switching element Sup according to change of the power supply voltage Vom in step S3.

For example, the power supply voltage Vom has a predetermined available range for the power supply voltage Vom, and dividing the available range for the power supply voltage Vom obtains a plurality of sections of a predetermined use voltage range of the power supply voltage Vom. Then, the rate varying unit 93 can store, as the first information IN1, modified information indicative of correlations (1) Between each of the sections of the use voltage range for the power supply voltage Vom and a corresponding one of the values of the output current Ic from the first current-power source 85

(2) Between each of the sections of the use voltage range for the power supply voltage Vom and a corresponding one of the values of the output current Id from the second current-power source 90.

The information N1 enables the rate varying unit 93 to select one of the values of the output current Ic or Id; the selected value of the output current Ic or Id matches with any of the sections of the use voltage range within which the actual value of the power supply voltage Vom is located.

FIG. 5 schematically illustrates an example of the modified information indicative of correlations between three sections of the use voltage range for the power supply voltage Vom and corresponding three values of the output current Ic from the first current-power source 85 in the form of a graph, i.e. a two-dimensional map. The two-dimensional map illustrated in FIG. 5 represents that that the use voltage range for the power supply voltage Vom is set to be the voltage range from a first voltage V1, for example 15 V, inclusive to a fourth voltage V4, for example 18 V, exclusive. The two-dimensional map also represents that the voltage range for the power supply voltage Vom from the first voltage V1 to the fourth voltage V4 is divided into the following first to third sections as the horizontal axis thereof:

The first section ranges from the first voltage V1 inclusive to a second voltage V2, for example 16 V, exclusive.

The second section ranges from the second voltage V2 inclusive to a third voltage V3, for example 17 V, exclusive.

The third section ranges from the third voltage V3 inclusive to the fourth voltage exclusive.

The vertical axis of the two-dimensional map represents the output current Ic from the first constant-current source 85.

The first value I1 of the output current Ic from the first constant-current source 85 matches with the first section, the second value I2 of the output current Ic from the first constant-current source 85 matches with the second section, and the third value I3 of the output current Ic from the first constant-current source 85 matches with the third section. The second value I2 of the output current Ic is higher than the first value I1 of the output current Ic, and the third value I3 of the output current Ic is higher than the second value I2 of the output current Ic.

Specifically, when the value of the power supply voltage Vom is located at or within the first section, the rate varying unit 93 determines, based on the modified information illustrated in FIG. 5, the first value I1 as the value of the output current Ic. When the value of the power supply voltage Vom is located at or within the second section, the rate varying unit 93 determines, based on the modified information illustrated in FIG. 5, the second value I2 as the value of the output current Ic. When the value of the power supply voltage Vom is located at or within the third section, the rate varying unit 93 determines, based on the modified information illustrated in FIG. 5, the third value I3 as the value of the output current Ic.

Note that, in the specification, the phrase "A is at or within the range" or other similar phrases means that A is within the range inclusive the upper and lower limits of the range.

The above driving device comprised of the drive circuit Dr provided for each of the switching elements Scp, Scn, and S*# according to the first embodiment is configured to (1) Adjust, based on change of the power supply voltage Vom, i.e. the output voltage across the corresponding secondary coil 60b, the value of the constant current Ic from the first constant-current source 85

(2) Adjust, based on change of the power supply voltage Vom, i.e. the output voltage across the corresponding secondary coil 60b, the value of the constant current Id from the second constant-current source 90.

This adjustment of the constant current Ic for charging enables the charging current for charging the gate of the corresponding switching element to be varied. This adjustment of the constant current Id for discharging also enables the discharging current for discharging the gate of the corresponding switching element to be varied.

This configuration of the driving device provided for each of the switching elements Scp, Scn, and S*# enables these adjustments of the constant currents Ic and Id to absorb fluctuations of the output voltage across the corresponding secondary coil 60b without providing regulators for regulating the output voltage across the corresponding secondary coil 60b.

This configuration of the driving device provided for each of the switching elements Scp, Scn, and S*# therefore makes it possible to accurately vary the switching-state changing rate CR of the corresponding switching element according to change of the output voltage across the corresponding secondary coil 60b with lower power loss and manufacturing cost.

The above driving device comprised of the drive circuit Dr provided for each of the switching elements Scp, Scn, and S*# according to the first embodiment is also configured to use the output voltage across the corresponding secondary coil 60b for varying the switching-state changing rate CR of the corresponding switching element. The output voltage across the corresponding secondary coil 60b, which is controlled by the control device 50 of the low-voltage system, is supplied as a control signal for varying the switching-state changing rate CR, from the low-voltage system to the driving device of the high-voltage system while the low-voltage system is electrically isolated from the high-voltage system. This therefore enables the control signal for the varying the switching-state changing rate CR to be transferred from the low-voltage system to the driving devices provided for the respective switching elements Scp, Scn, and S*# without using additional electrical isolating members except for the photocouplers 70a.

Second Embodiment

Figure 6:
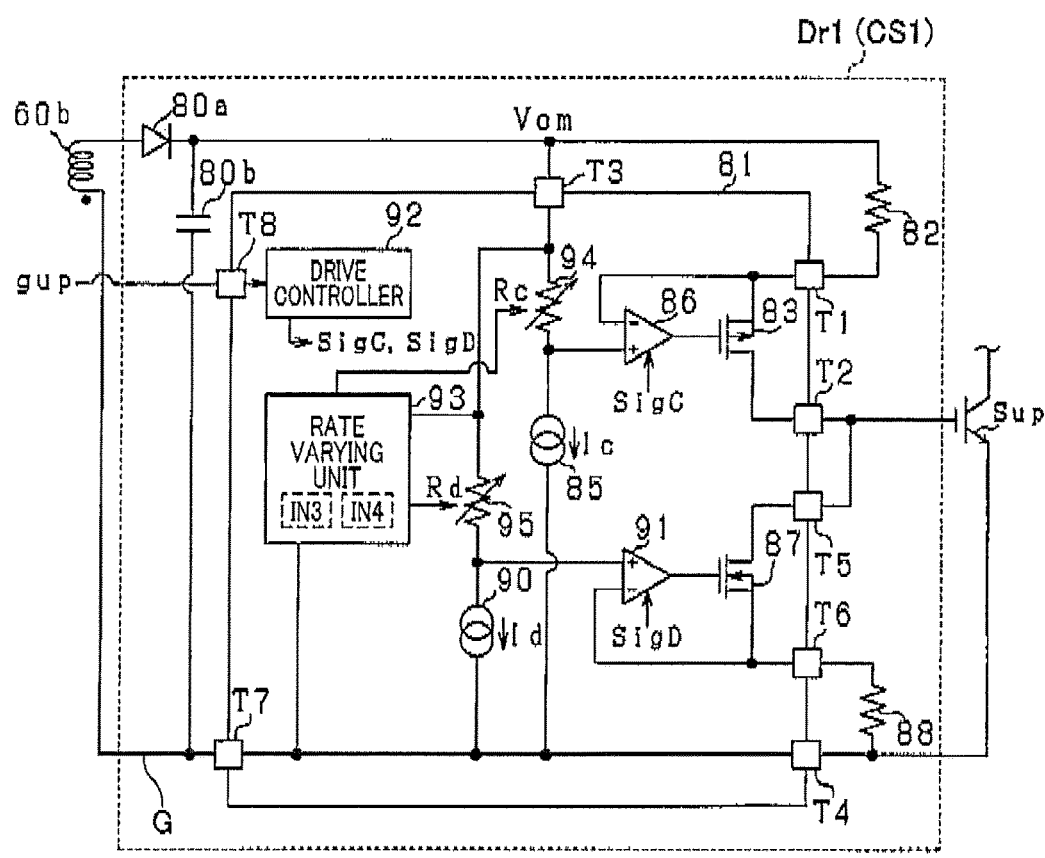
FIG. 6 is a circuit diagram schematically illustrating an example of the circuit structure of a driver circuit according to the second embodiment of the present disclosure.

The following describes a control system CS1 for the buck-boost converter 20 and the inverter 30, to which a driving device for semiconductor switching elements according to the second embodiment of the present disclosure has been applied, with reference to FIGS. 6 to 8.

The structure and functions of the control system CS1 are slightly different from those of the control system CS by the following points. So, the following describes mainly the different points.

Referring to FIG. 6, a drive circuit Dr1 of the control system CS1, which is provided for the U-phase switching element Sup, includes a rate varying unit 93a, a first adjustment resistor 94, and a second adjustment resistor 95 in place of the respective rate varying unit 93, the first adjustment resistor 84, and the second adjustment resistor 89. The rate voltage unit 93a is controllably connected to each of the first and second adjustment resistors 94 and 95. In other words, the first adjustment resistor 94 has a resistance Rc variable by the rate varying unit 93a, and the second adjustment resistor 95 has a resistance Rd variable by the rate varying unit 93a.

Note that the rate varying unit 93a has no function of changing the output current Ic from the first constant-current source 85, in other words, the output current Ic from the first constant-current source 85 is set to be a constant value. Similarly, the rate varying unit 93a has no function of changing the output current Id from the first constant-current source 85, in other words, the output current Id from the second constant-current source 90 is set to be a constant value.

Next, the following describes how the drive circuit Dr1 of the control system CS1 works.

As illustrated in FIG. 7B, the control device 50 performs the operations in steps S1 and S2, thus increasing or decreasing the reference voltage Vref of the reference power source 64b, i.e. the power supply voltage Vom, according to an increase or a decrease of the target switching-state changing rate TCR.

Next, the rate varying unit 93a adjusts the resistance Rc of the first adjustment resistor 94 or the resistance Rd of the second adjustment resistor 95 according to change of the power supply voltage Vom in step S3A of FIG. 7B.

Specifically, the rate varying unit 93a stores beforehand first information IN3 indicative of the correlations between the power supply voltage Vom and the resistance Rc of the first adjustment resistor 94. For example, the rate varying unit 93a stores, as the first information IN3, information configured such that, the lower the power supply voltage Vom is, the lower the resistance Rc is.

In addition, the rate varying unit 93a stores beforehand second information IN4 indicative of the correlations between the power supply voltage Vom and the resistance Rd of the second adjustment resistor 95. For example, the rate varying unit 93a stores, as the second information IN4, information configured such that, the lower the power supply voltage Vom is, the higher the resistance Rd is.

This causes the rate varying unit 93a of the drive circuit Dr1 to (1) Decrease the resistance Rc of the first adjustment resistor 94 with the decrease of the power supply voltage Vom so as to reduce the switching-state changing rate when the drive circuit Dr1 changes the switching element Sup from the off state to the on state (2) Increase the resistance Rd of the second adjustment resistor 95 with the decrease of the power supply voltage Vom so as to reduce the switching-state changing rate when the drive circuit Dr1 changes the switching element Sup from the on state to the off state.

Decreasing the resistance Rc of the first adjustment resistor 94 enables the voltage at the first terminal T1, which corresponds to the voltage input to the inverting input terminal of the first operational amplifier 86, to increase, so that the charging current flowing through the charging resistor 82 to the gate of the switching element Sup decreases. This results in reduction of the switching-state changing rate of the switching element Sup from the off state to the on state.

Increasing the resistance Rd of the second adjustment resistor 93 enables the voltage at the sixth terminal T6, which corresponds to the voltage input to the inverting input terminal of the second operational amplifier 91, to decrease, so that the discharging current flowing through the discharging resistor 88 from the gate of the switching element Sup decreases. This results in reduction of the switching-state changing rate of the switching element Sup from the on state to the off state.

Of course, the rate varying unit 93a of the drive circuit Dr1 increases the resistance Re of the first adjustment resistor 94 with an increase of the power supply voltage Vom so as to increase the switching-state changing rate when the drive circuit Dr1 changes the switching element Sup from the off state to the on state. Similarly, the rate varying unit 93a of the drive circuit Dr1 decreases the resistance Rd of the second adjustment resistor 95 with an increase of the power supply voltage Vom so as to increase the switching-state changing rate when the drive circuit Dr1 changes the switching element Sup from the on state to the off state.

The rate varying unit 93a can be configured to stepwisely vary the switching-state changing rate of the switching element Sup according to change of the power supply voltage Vom in step S3.

For example, the power supply voltage Vom has a predetermined available range for the power supply voltage Vom, and dividing the available range for the power supply voltage Vom obtains a plurality of sections of the use voltage range of the power supply voltage Vom. Then, the rate varying unit 93a can store, as the first information IN3, modified information indicative of correlations (1) Between each of the sections of the use voltage range for the power supply voltage Vom and a corresponding one of the values of the resistance Rc of the first adjustment resistor 94

(2) Between each of the sections of the use voltage range for the power supply voltage Vom and a corresponding one of the values of the resistance Rd of the second adjustment resistor 95.

The information N3 enables the rate varying unit 93a to select one of the values of the resistance Rc of the first adjustment resistor 94 or the resistance Rd of the second adjustment resistor 95; the selected value of the resistance Re or Rd matches with any of the sections of the use voltage range within which the actual value of the power supply voltage Vom is located.

FIG. 8 schematically illustrates an example of the modified information indicative of correlations between three sections of the use voltage range for the power supply voltage Vom and corresponding three values of the resistance Rc of the first adjustment resistor 94 in the form of a graph, i.e. a two-dimensional map. The horizontal axis of the two-dimensional map illustrated in FIG. 8 is identical to that of the two-dimensional map illustrated in FIG. 5.

The vertical axis of the two-dimensional map represents the resistance Rc of the first adjustment resistor 94.

The first value R1 of the resistance Rc of the first adjustment resistor Rc matches with the first section, the second value R2 of the resistance Rc of the first adjustment resistor Rc matches with the second section, and the third value R3 of the resistance Rc of the first adjustment resistor 94 matches with the third section. The second value r2 of the resistance Rc of the first adjustment resistor 94 is higher than the first value R1 of the resistance Rc of the first adjustment resistor 94, and the third value R3 of the resistance Rc of the first adjustment resistor 94 is higher than the second value R2 of the resistance Rc of the first adjustment resistor 94.

Specifically, when the value of the power supply voltage Vom is located at or within the first section, the rate varying unit 93a determines, based on the modified information illustrated in FIG. 8, the first value R1 as the value of the resistance Rc of the first adjustment resistor 94. When the value of the power supply voltage Vom is located at or within the second section, the rate varying unit 93a determines, based on the modified information illustrated in FIG. 8, the second value R2 as the value of the resistance Rc of the first adjustment resistor 94. When the value of the power supply voltage Vom is located at or within the third section, the rate varying unit 93a determines, based on the modified information illustrated in FIG. 8, the third value R3 as the value of the resistance Rc of the first adjustment resistor 94.

The above configuration of the driving device provided for each of the switching elements Scp, Scn, and S*# according to the second embodiment adjusts the value of the resistance Rc of the first adjustment resistor 94 and the value of the resistance Rd of the second adjustment resistor 95 according to change of the power supply voltage Vom. This adjustment enables a corresponding one of the constant currents Ic and Id to be adjusted according to change of the power supply voltage Vom. Thus, the driving device provided for each of the switching elements Scp, Scn, and S*# and the control system CS1 according to the second embodiment achieve substantially the same advantageous effects as those achieved by the corresponding driving device and the control system CS according to the first embodiment.

Third Embodiment

Figure 9:
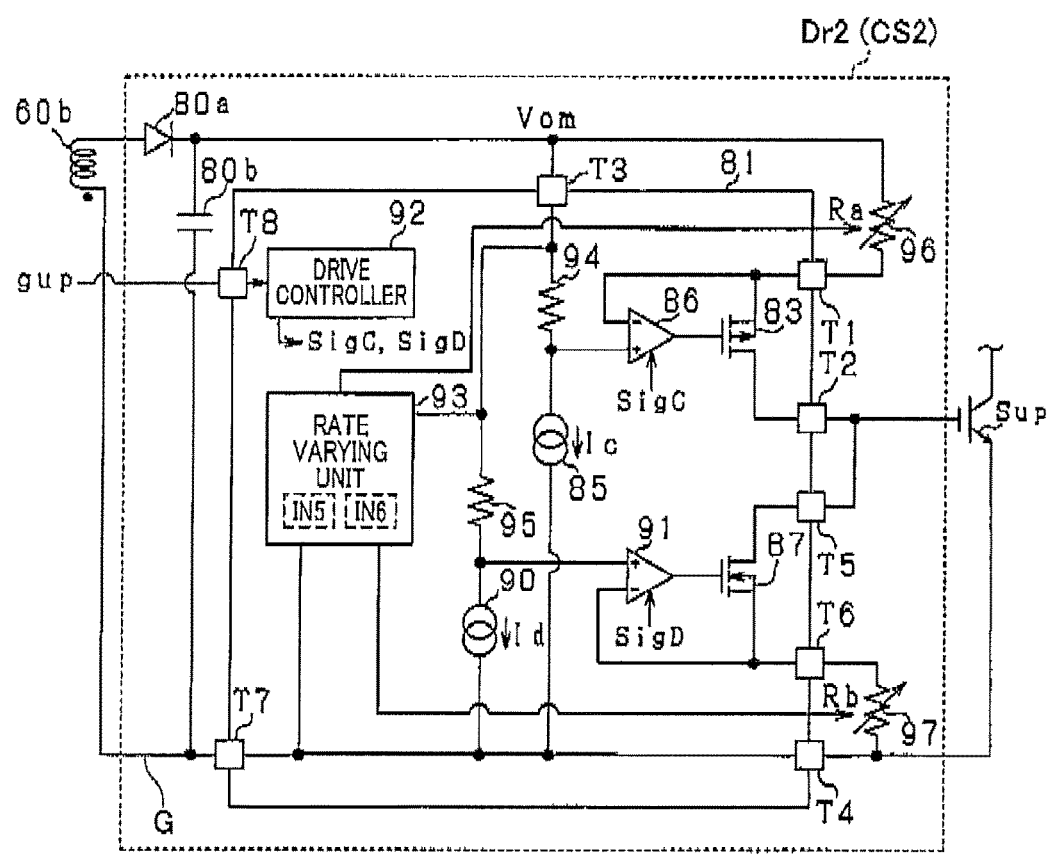
FIG. 9 is a circuit diagram schematically illustrating an example of the circuit structure of a driver circuit according to the third embodiment of the present disclosure.
Figures 10A, 10B:
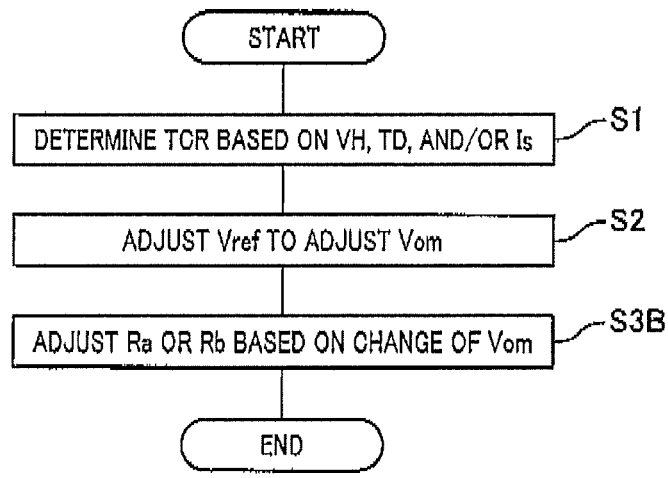
FIG. 10A is a table schematically illustrating how the control device and a rate varying unit illustrated in FIG. 9 operate according to the third embodiment.
FIG. 10B is a flowchart schematically illustrating an example of the sequence operations carried out by the control device and the rate varying unit according to the third embodiment.

The following describes a control system CS2 for the buck-boost converter 20 and the inverter 30, to which a driving device for semiconductor switching elements according to the third embodiment of the present disclosure has been applied, with reference to FIGS. 9, 10A, and 10B.

The structure and functions of the control system CS2 are slightly different from those of the control system CS by the following points. So, the following describes mainly the different points.

Referring to FIG. 9, a drive circuit Dr2 of the control system CS2, which is provided for the U-phase switching element Sup, includes a rate varying unit 93b, a charging resistor 96, and a discharging resistor 97 in place of the respective rate varying unit 93, the charging resistor 82, and the discharging resistor 88. The rate voltage unit 93b is controllably connected to each of the charging and discharging resistors 96 and 97. In other words, the charging resistor 96 a resistance Ra variable by the rate varying unit 93b, and the discharging resistor 97 has a resistance Rb variable by the rate varying unit 93b.

Note that the rate varying unit 93b has no function of changing the output current Ic from the first constant-current source 85, in other words, the output current Ic from the first constant-current source 85 is set to be a constant value. Similarly, the rate varying unit 93b has no function of changing the output current Id from the second constant-current source 90, in other words, the output current Ic from the second constant-current source 90 is set to be a constant value.

Next, the following describes how the drive circuit Dr2 of the control system CS2 works.

As illustrated in FIG. 10B, the control device 50 performs the operations in steps S1 and S2, thus increasing or decreasing the reference voltage Vref of the reference power source 64b, i.e. the power supply voltage Vom, according to an increase or a decrease of the target switching-state changing rate TCR.

Next, the rate varying unit 93b adjusts the resistance Ra of the charging resistor 96 or the resistance Rb of the discharging resistor 97 according to change of the power supply voltage Vom in step S3B of FIG. 10B.

Specifically, the rate varying unit 93a stores beforehand first information IN5 indicative of the correlations between the power supply voltage Vom and the resistance Ra of the charging resistor 96. For example, the rate varying unit 93b stores, as the first information IN5, information configured such that, the lower the power supply voltage Vom is, the higher the resistance Ra is.

In addition, the rate varying unit 93b stores beforehand second information IN6 indicative of the correlations between the power supply voltage Vom and the resistance Rb of the discharging resistor 97. For example, the rate varying unit 93b stores, as the second information IN6, information configured such that, the lower the power supply voltage Vom is, the higher the resistance Rb is.

This causes the rate varying unit 93b of the drive circuit Dr2 to (1) Increase the resistance Ra of the charging resistor 96 with the decrease of the power supply voltage Vom so as to reduce the switching-state changing rate when the drive circuit Dr2 changes the switching element Sup from the off state to the on state (2) Increase the resistance Rb of the discharging resistor 97 with the decrease of the power supply voltage Vom so as to reduce the switching-state changing rate when the drive circuit Dr2 changes the switching element Sup from the on state to the off state.

Increasing the resistance Ra of the charging resistor 96 enables the charging current flowing through the charging resistor 96 to the gate of the switching element Sup to decrease. This results in reduction of the switching-state changing rate of the switching element Sup from the off state to the on state.

Increasing the resistance Rb of the discharging resistor 97 enables the discharging current flowing through the discharging resistor 97 from the gate of the switching element Sup to decrease. This results in reduction of the switching-state changing rate of the switching element Sup from the on state to the off state.

Of course, the rate varying unit 93b of the drive circuit Dr2 reduces the resistance Ra of the charging resistor 96 with an increase of the power supply voltage Vom so as to increase the switching-state changing rate when the drive circuit Dr2 changes the switching element Sup from the off state to the on state. Similarly, the rate varying unit 93b of the drive circuit Dr2 decreases the resistance Rb of the discharging resistor 97 with an increase of the power supply voltage Vom so as to increase the switching-state changing rate when the drive circuit Dr2 changes the switching element Sup from the on state to the off state.

The rate varying unit 93b can be configured to stepwisely vary the switching-state changing rate of the switching element Sup according to change of the power supply voltage Vom in step S3 in the same approach illustrated in FIG. 8.

The above configuration of the driving device provided for each of the switching elements Scp, Scn, and S*# according to the third embodiment enables the switching-state changing rate CR of the corresponding switching element to be varied according to change of the output voltage across the corresponding secondary coil 60b without providing regulators for regulating the output voltage across the corresponding secondary coil 60b. Thus, the driving device provided for each of the switching elements Scp, Scn, and S*#, and the control system CS2 according to the third embodiment achieve substantially the same advantageous effects as those achieved by the corresponding driving device and the control system CS according to the first embodiment.

Fourth Embodiment

The following describes a control system CS3 for the buck-boost converter 20 and the inverter 30 with reference to FIGS. 11 to 13B. The structure and functions of the control system CS3 are slightly different from those of the control system CS by the following points. So, the following describes mainly the different points.

The isolated power supply system 80 according to the first embodiment includes the transformer 60 including the common primary coil 60a and the plurality of secondary coils 60b provided for the respective switching elements Scp, Scn, Sup, Svp, and Swp.

Figure 11:
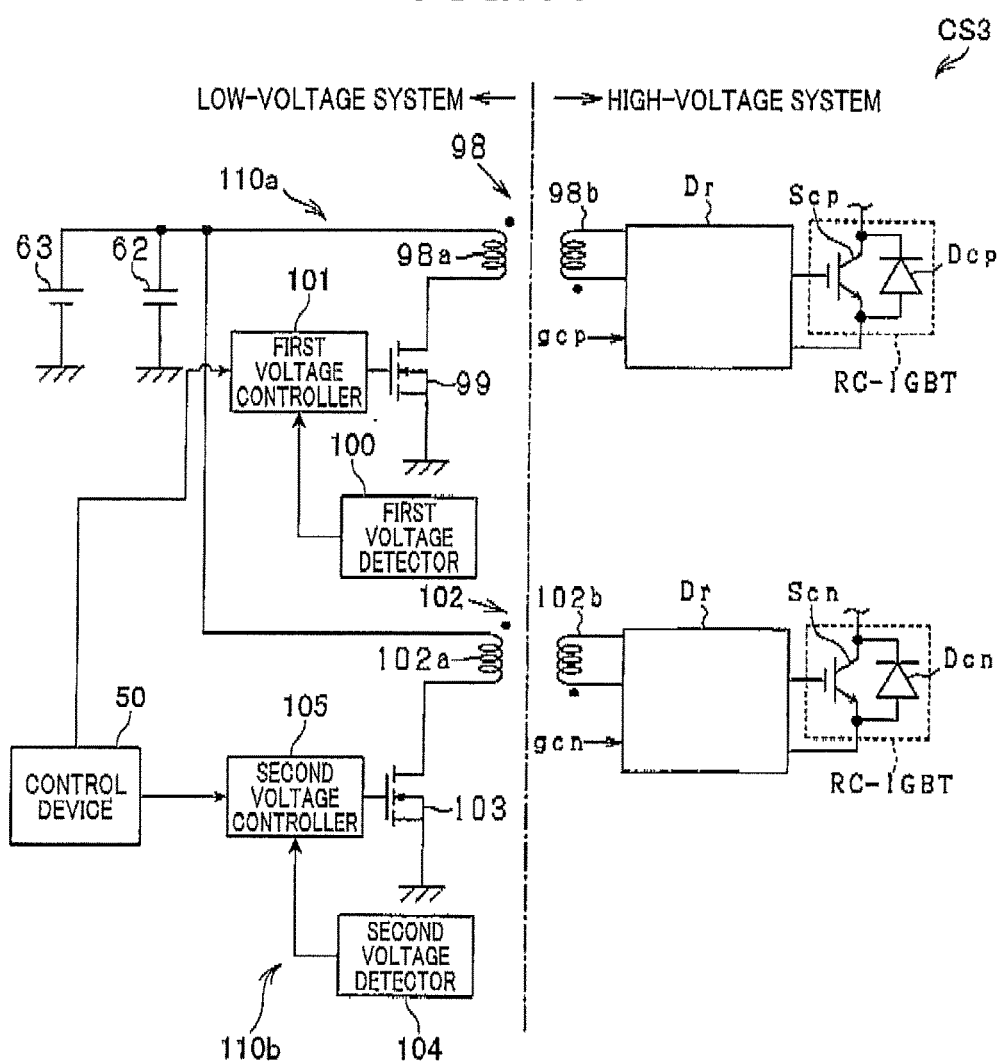
FIG. 11 is a circuit diagram schematically illustrating an example of the circuit structure of first and second isolated power supply systems according to the fourth embodiment of the present disclosure.

In contrast, referring to FIG. 11, the control system CS3 includes (1) A first isolated power supply system 110a for the upper-arm booster switching element Scp of the converter 20

(2) A second isolated power supply system 110b for the lower-arm booster switching element Scn of the converter 20 in addition to the isolated power supply system 60 for the upper- and lower-arm switching elements S*# of the inverter 30.

Specifically, the first isolated power supply system 110a includes a first transformer 98, a first control switching element, i.e. an N-channel MOSFET, 99, a first voltage detector 100, and a first voltage controller 101. The second isolated power supply system 110b includes a second transformer 102, a second control switching element, i.e. an N-channel MOSFET, 103, a second voltage detector 104, and a second voltage controller 105 in addition to the capacitor 62 and the low-voltage battery 63.

For example, at least the control device 50, the first control switching element 99, the low-voltage battery 63, and the first voltage controller 101 serve as an energization controller. Similarly, at least the control device 50, the second control switching element 103, the low-voltage battery 63, and the second voltage controller 105 serve as an energization controller.

The first and second isolated power supply systems 110a and 110b share the capacitor 62 and the low-voltage battery 63.

The first transformer 98 includes a primary winding 98a and a secondary coil 98b. The secondary coil 98b is connected to the drive circuit Dr provided for the upper-arm booster switching element Scp. The primary coil 98a is magnetically coupled to the secondary coil 98b while so electrically isolating the primary coil 98a from the secondary coil 98b.

The first voltage detector 100 and the first voltage controller 101 are substantially identical in structure to the respective voltage detector 65 and the voltage controller 64.

The connections between the primary coil 98a, the capacitor 62, the low-voltage battery 63, the first voltage detector 100, and the first voltage controller 101 are identical to the connections between the primary coil 60a, the capacitor 62, the low-voltage battery 63, the voltage detector 65, and the voltage controller 64.

Similarly, the second transformer 102 includes a primary winding 102a and a secondary coil 102b. The secondary coil 102b is connected to the drive circuit Dr provided for the lower-arm booster switching element Scn. The primary coil 102a is magnetically coupled to the secondary coil 102b while electrically isolating the primary coil 102a from the secondary coil 102b.

The second voltage detector 104 and the second voltage controller 105 are substantially identical in structure to the respective voltage detector 65 and the voltage controller 64. The connections between the primary coil 102a, the capacitor 62, the low-voltage battery 63, the second voltage detector 104, and the second voltage controller 105 are identical to the connections between the primary coil 60a, the capacitor 62, the low-voltage battery 63, the voltage detector 65, and the voltage controller 64.

The fourth embodiment uses a reverse-conducting IGBT (RC-IGBT) as each of the booster switching elements Scp and Scn. The RC-IGBT includes a semiconductor chip in which an IGBT and a flywheel diode connected in antiparallel thereto are monolithically integrated. The RC-IGBT has a characteristic that, when a voltage is applied to the gate while a forward current is flowing through the flywheel diode, the voltage drop across the flywheel diode is greater than the voltage drop across the flywheel diode when no voltage is applied to the gate while the same forward current is flowing through the flywheel diode. The following refers to the drive circuits Dr provided for the respective upper- and lower-arm booster switching elements Scp and Scn as booster drive circuit Dr.

Next, the following describes an example of the structure of each of the booster drive circuits Dr provided for the respective booster switching elements Scp and Scn according to the fourth embodiment.

Like the first embodiment, the rate varying unit 93 of each of the booster drive circuits Dr stores beforehand drive instruction information I10 and turn-off instruction information I11 for a corresponding one of the booster switching elements Scp and Scn.

The drive instruction information I10 stored in each of the booster drive circuits Dr is identical to the set of the first information I1 and the second information I2. That is, the first information I1 represents the correlations between the power supply voltage Vom and the output current Ic, which correlates with the gate charging current, from the first constant-current source 85. The second information I2 represents the correlations between the power supply voltage Vom and the output current Id, which correlates with the gate discharging current, from the second constant-current source 90.

The turn-off instruction information I11 stored in each of the booster drive circuits Dr represents the correlations between turn-off instructions for the corresponding booster switching element and the power supply voltage Vom.

For example, the drive instruction information I10 according to the fourth embodiment represents (1) The correlations between the predetermined use voltage range of the power supply voltage Vom from the first voltage V1 to the fourth voltage V4 (see FIG. 5) and the output current Ic (2) The correlations between the predetermined use voltage range of the power supply voltage Vom from the first voltage V1 to the fourth voltage V4 and the output current Id.

At that time, the turn-off instruction information I11 represents the correlations between the turn-off instructions for the respective booster switching elements Scp and Scn and a predetermined turn-off voltage range within a predetermined allowable voltage range of the power supply voltage Vom. In particular, the predetermined turn-off voltage range is determined to be outside of the use voltage range from the first voltage V1 inclusive to the fourth voltage V4 exclusive. For example, the voltage range equal to or higher than the fourth voltage V4 within the allowable voltage range of the power supply voltage Vom is determined as the turn-off voltage range.

The control device 50 adjusts the reference voltage Vref in the first voltage controller 101 such that the output voltage across the corresponding secondary coil 98b is at or within the turn-off voltage range determined by the turn-off instruction information I11 when operating the inverter 30 in the power running mode. In the power running mode, the buck-boost converter 20 is boosting the DC voltage output from the high-voltage battery 10.

The control device 50 also adjusts the reference voltage Vref in the second voltage controller 105 such that the output voltage across the corresponding secondary coil 102 is at or within the use voltage range determined by the drive instruction information I10 when operating the inverter 30 in the power running mode.

On the other hand, the control device 50 adjusts the reference voltage Vref in the first voltage controller 101 such that the output voltage across the corresponding secondary coil 98b is at or within the use voltage range determined by the drive instruction information I10 when operating the inverter 30 in the regenerative mode. In the regenerative mode, the buck-boost converter 20 is stepping down the DC voltage output from the high-voltage battery 10.

The control device 50 also adjusts the reference voltage Vref in the second voltage controller 105 such that the output voltage across the corresponding secondary coil 102 is located at or within the turn-off voltage range determined by the turn-off instruction information I11 when operating the inverter 30 in the regenerative mode.

Referring to FIGS. 12A to 12C, the rate varying unit 93 provided for the lower-arm booster switching element Scn determines whether the measured power supply voltage Vom is located at or within the use voltage range determined by the drive instruction information I10 in the power running mode in step S10 of FIG. 12B.

Upon determining that the measured power supply voltage Vom is located at or within the use voltage range determined by the drive instruction information I10 (YES in step S10), the rate varying unit 93 adjusts the output current Ic from the first constant-current source 85 or the output current Id from the second constant-current source 90 according to change of the power supply voltage Vom in step S11. In other words, the rate varying unit 93 adjusts the output current Ic from the first constant-current source 85 or the output current Id from the second constant-current source 90 according to change of the second voltage VH, the measured temperature TD, and/or the current flowing through the lower-arm booster switching element Scn in step S11. This enables the lower-arm booster switching element Scn to be turned on or off according to the adjusted output current Ic or Id. Otherwise, upon determining that the measured power supply voltage Vom is outside of the use voltage range determined by the drive instruction information I10 (NO in step S10), the rate varying unit 93 terminates the routine illustrated in FIG. 12B.

On the other hand, the rate varying unit 93 provided for the upper-arm booster switching element Scp determines whether the measured power supply voltage Vom is located at or within the turn-off voltage range determined by the turn-off instruction information I11 in the power running mode in step S20 of FIG. 12C.

Upon determining that the measured power supply voltage Vom is located at or within the turn-off voltage range determined by the turn-off instruction information I11 (YES in step S20), the rate varying unit 93 instructs the drive controller 92 to stop output of the enable signals SigC and SigD to the respective first and second operational amplifiers 86 and 91 in step S21. This maintains the upper-arm booster switching element Scp in the off state in the power running mode. Otherwise, upon determining that the measured power supply voltage Vom is outside of the turn-off voltage range determined by the turn-off instruction information I11 (NO in step S20), the rate varying unit 93 terminates the routine illustrated in FIG. 12C.

Figure 13A:
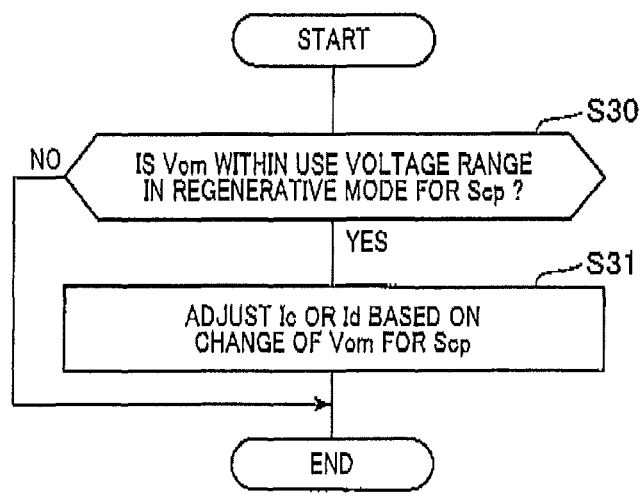
FIG. 13A is a flowchart schematically illustrating an example of the sequence operations carried out by the control device and the rate varying unit for the lower-arm booster switching element in the power running mode according to the fourth embodiment.
Figure 13B:
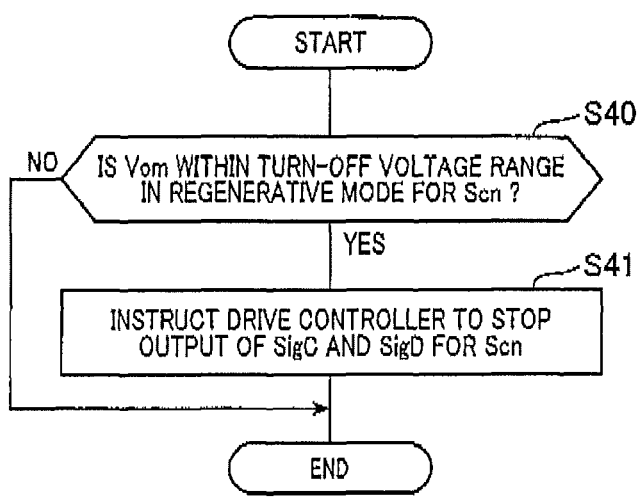
FIG. 13B is a flowchart schematically illustrating an example of the sequence operations carried out by the control device and the rate varying unit for the lower-arm booster switching element in the regenerative mode according to the fourth embodiment.

In addition, referring to FIGS. 12A, 13A, and 13B, the rate varying unit 93 provided for the upper-arm booster switching element Scp determines whether the measured power supply voltage Vom is located at or within the use voltage range determined by the drive instruction information I10 in the regenerative mode in step S30 of FIG. 13A.

Upon determining that the measured power supply voltage Vom is located at or within the use voltage range determined by the drive instruction information I10 (YES in step S30), the rate varying unit 93 adjusts the output current Ic from the first constant-current source 85 or the output current Id from the second constant-current source 90 according to change of the power supply voltage Vom in step S31. This enables the upper-arm booster switching element Scp to be turned on or off according to the adjusted output current Ic or Id. Otherwise, upon determining that the measured power supply voltage Vom is outside of the use voltage range determined by the drive instruction information I10 (NO in step S30), the rate varying unit 93 terminates the routine illustrated in FIG. 13A.

On the other hand, the rate varying unit 93 provided for the lower-arm booster switching element Scn determines whether the measured power supply voltage Vom is located at or within the turn-off voltage range determined by the turn-off instruction information I11 in the regenerative mode in step 340 of FIG. 13B.

Upon determining that the measured power supply voltage Vom is located at or within the turn-off voltage range determined by the turn-off instruction information I11 (YES in step S40), the rate varying unit 93 instructs the drive controller 92 to stop output of the enable signals SigC and SigD to the respective first and second operational amplifiers 86 and 91 in step S41. This maintains the lower-arm booster switching element Scn in the off state in the regenerative mode. Otherwise, upon determining that the measured power supply voltage Vom is outside of the turn-off voltage range determined by the turn-off instruction information I11 (NO in step S40), the rate varying unit 93 terminates the routine illustrated in FIG. 13B.

The above control system CS3 includes the first isolated power supply system 110a provided for the upper-arm booster drive circuit Dr for the upper-arm booster switching element Scp, and the second isolated power supply system 110b provided for the lower-arm booster drive circuit Dr for the lower-arm booster switching element Scn.

This configuration of the control system CS3 enables the output voltage across the secondary coil 98b for supplying power to the upper-arm booster drive circuit Dr and the output voltage across the secondary coil 102b for supplying power to the lower-arm booster drive circuit Dr to be individually adjusted. This makes it possible to individually control on-off operations of the upper- and lower-arm booster switching elements Scp and Scn according to whether the inverter 30, i.e. the converter 20, is operating in the power running mode or the regenerative mode.

The fourth embodiment, which uses an RC-IGBT as each of the upper- and lower-arm switching elements Scp and Scn, achieves the following advantageous effects in addition to the advantageous effects achieved by the first embodiment.

Specifically, the lower-arm booster drive circuit Dr alternately turns on and off the lower-arm booster switching element Scn while the upper-arm switching element Scp is kept in the off state in the power running mode. This reduces power loss across the flywheel diode Dcp connected in antiparallel to the upper-arm booster switching element Scp in the power running mode.

The upper-arm booster drive circuit Dr alternately turns on and off the upper-arm booster switching element Scp while the lower-arm switching element Scn is kept in the off state in the regenerative mode. This reduces power loss across the flywheel diode Dcn connected in antiparallel to the lower-arm booster switching element Scn in the regenerative mode.

The present disclosure is not limited to the aforementioned embodiments, and can be modified within the scope thereof.

The control device 50 according to the first embodiment adjusts the reference voltage Vref of the reference power source 64b such that (1) The reference voltage Vref increases with an increase of the target switching-state changing rate TCR (2) The reference voltage Vref decreases with a decrease of the target switching-state changing rate TCR (see step S2 and FIG. 4).

The control device 50 according to the present disclosure can freely adjust the reference voltage Vref according to change of the target switching-state changing rate TCR.

For example, the control device 50 can adjust the reference voltage Vref of the reference power source 64b such that (1) The reference voltage Vref increases with a decrease of the target switching-state changing rate TCR (2) The reference voltage Vref decreases with an increase of the target switching-state changing rate TCR.

In this modification, the rate varying unit 93 can store, as the first information IN1, information configured such that, the higher the power supply voltage Vom is, the lower the output current Ic is, and, as the second information IN2, information configured such that, the higher the power supply voltage Vom is, the higher the output current Id is.

The rate varying unit 93 according to the first embodiment stepwise increases the output current Ic from the first constant-current source 85 according to an increase of the power supply voltage Vom as illustrated in FIG. 5.

The rate varying unit 93 according to the present disclosure can freely set values of the output current Ic from the first constant-current source 85, i.e. values of the switching-state changing rate; the values of the output current Ic correlates with predetermined values or predetermined voltage ranges of the power supply voltage Vom. For example, the rate varying unit 93 can determine the third value I3 as the value of the output current Ic when the value of the power supply voltage Vom is located at or within the second section defined from the second voltage V2 inclusive to the third voltage V3 exclusive. The rate varying unit 93 can also determine the second value I2 as the value of the output current Ic when the value of the power supply voltage Vom is located at or within the third section defined from the third voltage V3 inclusive to the fourth voltage V4 exclusive.

Each of the drive circuit Dr can include any one of the constant-current driver for charging the gate of the corresponding switching element and the constant-current driver for discharging the gate of the corresponding switching element.

The present disclosure can use another semiconductor switching element in place of an IGBT for each of the switching elements Sp, Scn, and S*#. For example, a MOSFET is used for each of switching elements Scp, Scn, and S*#, a predetermined potential difference, which is higher than a predetermined potential, is applied between the gate and source of the MOSFET enables the MOSFET to be turned on.

The control device 50 according to the first embodiment adjusts the reference voltage Vref to perform on-off switching operations of the control switching element 61, thus adjusting the output voltage across each of the secondary coils 60b to the target voltage determined based on the reference voltage Vref as illustrated in FIG. 12. The control device 50 according to the present disclosure can freely adjust the output voltage across each of the secondary coils 60b to the target voltage determined based on the reference voltage Vref as illustrated in FIG. 2.

For example, the control device 50 can variably set the resistance of the first resistor 65c, and adjust the resistance of the first resistor 65c without changing the reference voltage Vref as disclosed in the Patent Publication No. 4844653. This adjustment of the resistance of the first resistor 65c enables on-off switching operations of the control switching element 61 to be performed, thus adjusting the output voltage across each of the secondary coils 60b to the target voltage determined based on the reference voltage Vref as illustrated in FIG. 2. For example, the control device 50 can increase the resistance of the first resistor 65c with an increase of the target voltage.

The control device 50 and the rate varying unit 93 adjust the switching-state changing rate CR according to change of the temperature TD measured by the temperature sensor 46 as one of the various parameters correlating with the operating conditions of the switching element Sup. The control device 50 and the rate varying unit 93 according to the present disclosure can adjust the switching-state changing rate CR according to change of the temperature of the coolant measured by the temperature sensor 45 in place of the temperature TD measured by the temperature sensor 4. In this modification, the photocoupler 71 illustrated in FIG. 2 can be eliminated.

The control device 50 and the rate varying unit 93 according to the present disclosure can adjust the switching-state changing rate CR according to change of at least one of the second voltage VH, the measured temperature TD, and the current flowing through the corresponding switching element.

The charging and discharging resistors 82 and 96 can be installed in the IC 81 of each drive circuit Dr.

Each of the control systems CS, CS1, CS2, and CS3 includes the single inverter 30 for controlling the single MG 40, but each of the control systems CS, CS1, CS2, and CS3 can includes a plurality of inverters 30 for respectively controlling a plurality of MGs 40.

While the illustrative embodiments of the present disclosure have been described herein, the present disclosure is not limited to the embodiments described herein, but includes any and all embodiments having modifications, omissions, combinations (e.g., of aspects across various embodiments), adaptations and/or alternations as would be appreciated by those in the art based on the present disclosure. The limitations in the claims are to be interpreted broadly based on the language employed in the claims and not limited to examples described in the present specification or during the prosecution of the application, which examples are to be construed as non-exclusive.

What is claimed is:

1. A driving device for changing a semiconductor switching element, having an on-off control terminal, between an on state and an off state according to a power supply voltage input thereto, the driving device comprising:
   a constant-current driver configured to generate a constant current based on the power supply voltage, and to perform at least one of charging and discharging of the on-off control terminal of the semiconductor switching element using the generated constant current so as to change the semiconductor switching element from one of the on state and off state to the other thereof; and
   a rate varying unit to which the power supply voltage is input,
   the rate varying unit including a storage that stores correlation information between the power supply voltage and the constant current, the rate varying unit being configured to adjust, based on the correlation information stored in the storage, a value of the constant current so as to vary a rate of changing the semiconductor switching element from one of the on state and the off state to the other thereof.

2. The driving device according to claim 1, wherein the constant-current driver comprises at least one of:
   a charging unit configured to generate, as the constant current, a first constant current based on the power supply voltage, and to charge the on-off control terminal of the semiconductor switching element based on the generated first constant current so as to change the semiconductor switching element from the off state to the on state; and
   a discharging unit configured to generate, as the constant current, a second constant current based on the power supply voltage, and to discharge the on-off control terminal of the semiconductor switching element based on the generated second constant current so as to change the semiconductor switching element from the on state to the off state.

3. The driving device according to claim 2, wherein the driving device comprises at least the charging unit.

4. The driving device according to claim 2, wherein:
   the driving device is connected to a power source for supplying the power supply voltage to the driving device;
   the driving device comprises at least the charging unit; and
   the charging unit comprises:
      an adjustment resistor having opposing first and second ends, the first end being connected to the power source;
      a constant-current source connected to the second end of the adjustment resistor and configured to generate an output current;

a charging resistor having opposing first and second ends, the first end being connected to the power source;

a charging switching element connected between the second end of the charging resistor and the on-off control terminal of the semiconductor switching element; and a comparator driver connected to a connection point between the second end of the adjustment resistor and the constant-current source and connected to the second end of the charging resistor, the comparator driver being configured to:

compare a voltage at the connection point with a voltage at the second end of the charging resistor; and drive the charging switching element according to a result of the comparison of the voltage at the connection point with the voltage at the second end of the charging resistor, the correlation information represents a correlation between the constant current output from the constant-current source and the power supply voltage; and the rate varying unit is configured to adjust, based on the correlation information and the power supply voltage, the value of the output current from the constant-current source, thus varying the value of the constant current.

5. The driving device according to claim 2, wherein:

the driving device is connected to a power source for supplying the power supply voltage to the driving device;

the driving device comprises at least the charging unit; and the charging unit comprises:

an adjustment resistor having opposing first and second ends and a variable resistance, the first end being connected to the power source;

a constant-current source connected to the second end of the adjustment resistor and configured to generate an output current;

a charging resistor having opposing first and second ends, the first end being connected to the power source;

a charging switching element connected between the second end of the charging resistor and the on-off control terminal of the semiconductor switching element; and a comparator driver connected to a connection point between the second end of the adjustment resistor and the constant-current source and connected to the second end of the charging resistor, the comparator driver being configured to:

compare a voltage at the connection point with a voltage at the second end of the charging resistor; and drive the charging switching element according to a result of the comparison of the voltage at the connection point with the voltage at the second end of the charging resistor, the correlation information represents a correlation between the constant current output from the constant-current source and the resistance of the adjustment resistor, and the rate varying unit is configured to adjust, based on the correlation information and the power supply voltage, a value of the resistance of the adjustment resistor, thus varying the value of the constant current.

6. The driving device according to claim 2, wherein:

the driving device is connected to a power source for supplying the power supply voltage to the driving device;

the driving device comprises at least the charging unit; and the charging unit comprises:

an adjustment resistor having opposing first and second ends, the first end being connected to the power source;

a constant-current source connected to the second end of the adjustment resistor and configured to output the constant current;

a charging resistor having opposing first and second ends and a variable resistance, the first end being connected to the power source;

a charging switching element connected between the second end of the charging resistor and the on-off control terminal of the semiconductor switching element; and a comparator driver connected to a connection point between the second end of the adjustment resistor and the constant-current source and connected to the second end of the charging resistor, the comparator driver being configured to:

compare a voltage at the connection point with a voltage at the second end of the charging resistor; and drive the charging switching element according to a result of the comparison of the voltage at the connection point with the voltage at the second end of the charging resistor;

the correlation information represents a correlation between the constant current output from the constant-current source and the resistance of the charging resistor, and the rate varying unit is configured to adjust, based on the correlation information and the power supply voltage, a value of the resistance of the charging resistor, thus varying the value of the constant current.

7. The driving device according to claim 1, further comprising an isolated power supply system comprising:

a transformer including a primary coil and a secondary coil magnetically coupled to the primary coil and electrically isolated from the primary coil, the secondary coil being connected to the constant-current driver so that an output voltage across the secondary coil serves as the power supply voltage; and an energization controller configured to control energization of the primary coil to adjust the output voltage across the secondary coil, the constant-current driver being configured to measure the output voltage across the secondary voltage as the power supply voltage.

8. The driving device according to claim 7, wherein:

the semiconductor switching element has an input terminal and an output terminal, and is configured to be turned on upon a potential difference between the output terminal and the on-off control terminal being higher than a predetermined potential; and the energization controller is configured to:

obtain a voltage at the input terminal of the semiconductor switching element; and control energization of the primary coil according to the voltage at the input terminal of the semiconductor switching element to adjust the output voltage across the secondary coil such that, the higher the voltage at the input terminal of the semiconductor switching element is, the lower the rate of changing the semiconductor switching element from one of the on state and the off state to the other thereof.

9. The driving device according to claim 7, wherein:
the energization controller is configured to:
  obtain a temperature of the semiconductor switching element; and
  control energization of the primary coil according to the temperature of the semiconductor switching element to adjust the output voltage across the secondary coil such that, the lower the temperature of the semiconductor switching element is, the lower the rate of changing the semiconductor switching element from one of the on state and the off state to the other thereof.

10. The driving device according to claim 7, wherein:
the energization controller is configured to:
  obtain a current flowing through the semiconductor switching element; and
  control energization of the primary coil according to the current flowing through the semiconductor switching element to adjust the output voltage across the secondary coil such that, the higher the current flowing through the semiconductor switching element is, the lower the rate of changing the semiconductor switching element from one of the on state and the off state to the other thereof.

11. A control system for controlling a buck-boost converter operating in a boosting mode to boost a first input voltage and in a bucking mode to reduce a second input voltage, the buck-boost converter comprising:
  a series-connection switch including an upper-arm semiconductor switching element and a lower-arm semiconductor switching element connected in series to each other, each of the upper-arm semiconductor switching element and lower-arm semiconductor switching element having an on-off control terminal;
  an inductor connected to a connection point between the upper- and lower-arm semiconductor switching elements; and
  flywheel diodes connected antiparallel to the respective upper- and lower-arm semiconductor switching elements,
  the control system comprising:
    an upper-arm driving device provided for the upper-arm semiconductor switching element for changing the upper-arm semiconductor switching element between an on state and an off state according to a first power supply voltage input thereto; and
    a lower-arm driving device provided for the lower-arm semiconductor switching element for changing the lower-arm semiconductor switching element between an on state and an off state according to a second power supply voltage input thereto,
    each of the upper-arm driving device and the lower-arm driving device comprising:
      a constant-current driver configured to generate a constant current based on a corresponding one of the first and second power supply voltages, and to perform at least one of charging and discharging of the on-off control terminal of the semiconductor switching element using the generated constant current so as to change the semiconductor switching element from one of the on state and off state to the other thereof, and
      a rate varying unit to which one of the first and second power supply voltages is input,
      the rate varying unit including a storage that stores correlation information between the one of the first and second power supply voltages and the constant current, the rate varying unit being configured to adjust, based on the correlation information stored in the storage, a value of the constant current so as to vary a rate of changing the semiconductor switching element from one of the on state and the off state to the other thereof.

12. The control system according to claim 11, wherein each of the upper-arm driving device and the lower-arm driving device comprises:
  an isolated power supply system comprising:
    a transformer including a primary coil and a secondary coil magnetically coupled to the primary coil and electrically isolated from the primary coil, the secondary coil being connected to the constant-current driver so that an output voltage across the secondary coil serves as a corresponding one of the first and second power supply voltages; and
    an energization controller configured to control energization of the primary coil to adjust the output voltage across the secondary coil,
  the constant-current driver being configured to measure the output voltage across the secondary voltage as a corresponding one of the first and second power supply voltages.

13. The control system according to claim 12, wherein:
each of the first and second power supply voltages includes a use voltage range;
the correlation information comprises:
  drive instruction information indicative of a correlation between the use voltage range of a corresponding one of the first and second power supply voltages and the constant current; and
  turn-off instruction information indicative of a turn-off voltage range of a corresponding one of the first and second power supply voltages, the turn-off voltage range being outside of the use voltage range;
the energization controller of the lower-arm driving device is configured to:
  control energization of the primary coil to adjust the output voltage across the secondary coil so as to be at or within the use voltage range included in the drive instruction information while the buck-boost converter is operating in the boosting mode; and
  control energization of the primary coil to adjust the output voltage across the secondary coil so as to be at or within the turn-off voltage range included in the turn-off instruction information while the buck-boost converter is operating in the bucking mode;
the energization controller of the upper-arm driving device is configured to:
  control energization of the primary coil to adjust the output voltage across the secondary coil to be at or within the turn-off voltage range included in the turn-off instruction information while the buck-boost converter is operating in the boosting mode; and
  control energization of the primary coil to adjust the output voltage across the secondary coil to be at or within the use voltage range included in the drive instruction information while the buck-boost converter is operating in the bucking mode;
the rate varying unit of the lower-arm driving device is configured to:

perform on and off operations of the lower-arm semiconductor switching element upon the output voltage across the secondary coil being at or within the use voltage range included in the drive instruction information; and maintain the lower-arm semiconductor switching element in the off state upon the output voltage across the secondary coil is at or within the turn-off voltage range included in the turn-off instruction information; and the rate varying unit of the upper-arm driving device is configured to:

perform on and off operations of the upper-arm semiconductor switching element upon the output voltage across the secondary coil being at or within the use voltage range included in the drive instruction information; and maintain the upper-arm semiconductor switching element in the off state upon the output voltage across the secondary coil being at or within the turn-off voltage range included in the turn-off instruction information.

14. A control system for controlling a power converter, the power converter comprising a series-connection switch including an upper-arm semiconductor switching element and a lower-arm semiconductor switching element connected in series to each other, each of the upper-arm semiconductor switching element and lower-arm semiconductor switching element having an on-off control terminal, the control system comprising:

an upper-arm driving circuit provided for the upper-arm semiconductor switching element for changing the upper-arm semiconductor switching element between an on state and an off state according to a first power supply voltage input thereto;

a lower-arm driving circuit provided for the lower-arm semiconductor switching element for changing the lower-arm semiconductor switching element between an on state and an off state according to a second power supply voltage input thereto, each of the upper-arm driving circuit and the lower-arm driving circuit comprising:

a constant-current driver configured to generate a constant current based on a corresponding one of the first and second power supply voltages, and to perform at least one of charging and discharging of the on-off control terminal of the semiconductor switching element using the generated constant current so as to change the semiconductor switching element from one of the on state and off state to the other thereof; and a rate varying unit to which one of the first and second power supply voltages is input, the rate varying unit including a storage that stores correlation information between the one of the first and second power supply voltages and the constant current, the rate varying unit being configured to adjust, based on the correlation information stored in the storage, a value of the constant current so as to vary a rate of changing the semiconductor switching element from one of the on state and the off state to the other thereof; and an isolated power supply system comprising:

a transformer including a primary coil and a secondary coil magnetically coupled to the primary coil and electrically isolated from the primary coil, the secondary coil being connected to the constant-current driver of each of the upper- and lower-arm driving circuits so that an output voltage across the secondary coil serves as the power supply voltage; and an energization controller configured to control energization of the primary coil to adjust the output voltage across the secondary coil.

* * * * *